United States Patent [19]
Higashi

[11] Patent Number: 6,136,632
[45] Date of Patent: Oct. 24, 2000

[54] ACTIVE MATRIX SUBSTRATE, METHOD OF PRODUCING AN ACTIVE MATRIX SUBSTRATE, LIQUID CRYSTAL DISPLAY DEVICE, AND ELECTRONIC EQUIPMENT

[75] Inventor: Seiichiro Higashi, Suwa, Japan

[73] Assignee: Seiko Epson Corporation, Tokyo, Japan

[21] Appl. No.: 08/894,621

[22] PCT Filed: Dec. 26, 1996

[86] PCT No.: PCT/JP96/03809

§ 371 Date: Aug. 22, 1997

§ 102(e) Date: Aug. 22, 1997

[87] PCT Pub. No.: WO97/23806

PCT Pub. Date: Jul. 3, 1997

[30] Foreign Application Priority Data

Dec. 26, 1995 [JP] Japan ..................................... 7-339749

[51] Int. Cl.[7] .......................... H01L 21/84; H01L 29/04; H01L 31/036; H01L 31/0376
[52] U.S. Cl. ............................ 438/166; 438/487; 257/52; 257/75; 257/88; 257/353
[58] Field of Search .................................... 438/166, 487; 117/904; 257/347, 352, 353, 52, 75, 88

[56] References Cited

U.S. PATENT DOCUMENTS

| | | | |
|---|---|---|---|
| 4,330,363 | 5/1982 | Biegesen et al. | 156/620 |
| 4,439,245 | 3/1984 | Wu | 117/8 |
| 4,482,395 | 11/1984 | Hiramoto | 438/799 |
| 5,529,951 | 6/1996 | Noguchi et al. | 438/487 |
| 5,572,046 | 11/1996 | Takemura | 257/66 |
| 5,767,003 | 6/1998 | Noguchi | 438/487 |
| 5,803,965 | 9/1998 | Yoon | 117/4 |
| 5,804,471 | 9/1998 | Yamazki et al. | 438/154 |
| 5,854,803 | 12/1998 | Yamazaki et al. | 372/31 |

FOREIGN PATENT DOCUMENTS

| | | |
|---|---|---|
| 3-286518 | 12/1991 | Japan . |
| 8-213341 | 8/1996 | Japan . |
| 9-61843 | 3/1997 | Japan . |

OTHER PUBLICATIONS

425° C Poly–Si TFT Technology and Its Applications to Large Size LCDs and Integrated Digital Date Drivers S. Inoue et al., ASIA Display, 1995 (pp. 339–342).
A 6–bit–Color VGA Low–Temperature Poly–Si TFT–LCD with integrated Digital Data Drivers Y. Matsueda et al., SID 98 Digest, 1998 (pp. 879–882).
Low–Temperature Poly–Si FTF–LCD with integrated 6–bit Digital Data Drivers Y. Matsueda et al., SID 96 Digest, 1996 (pp. 21–24).
"The American Heritage Dictionary of the English Language, New College Edition," William Morris (Editor), pp.288,289,1102,1103, 1976.

Primary Examiner—Brian Dutton
Attorney, Agent, or Firm—Oliff & Berridge, PLC

[57] ABSTRACT

An amorphous silicon film formed on the surface of a substrate is subjected to a laser annealing process in which the silicon film 30 is irradiated by a line-shaped laser beam having an irradiation area extending a greater length in a X direction and having an optical power profile with a half-width in a Y direction smaller than a pixel pitch in the Y direction. The line-shaped laser beam is fixed and the substrate on a stage is moved in the Y direction in such a manner that when the line-shaped laser beam strikes an area of an active matrix section in which a TFT is formed, the stage is moved at a low speed, while the stage is moved at a high speed when the line-shaped laser beam strikes other areas which do not require irradiation. As for an area in areas which a data driver section including TFTs arranged in a complicated fashion will be formed, the entire area is irradiated by the laser beam.

24 Claims, 23 Drawing Sheets

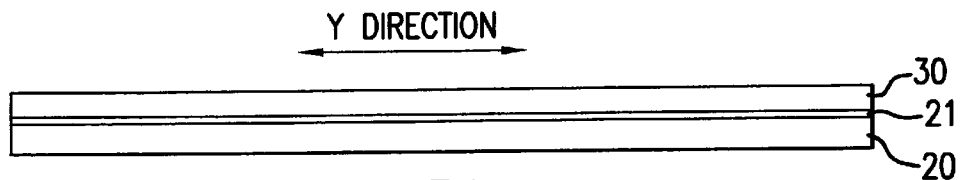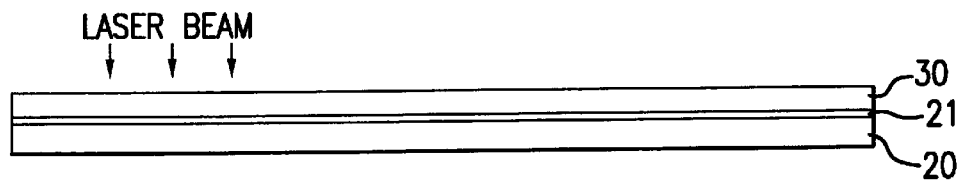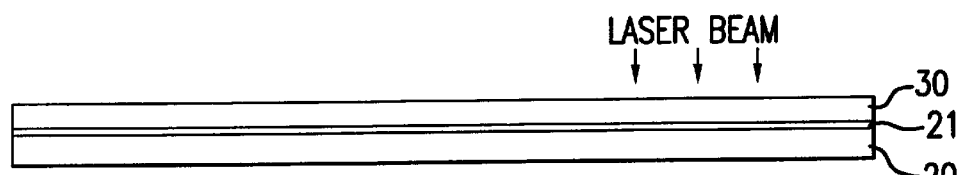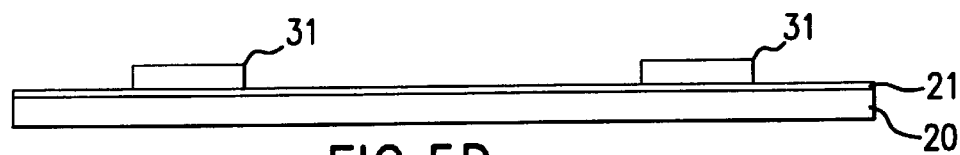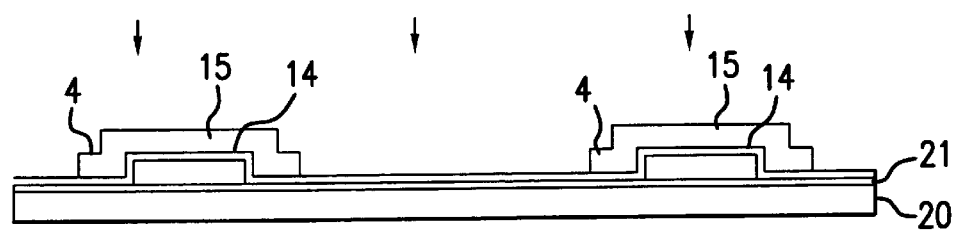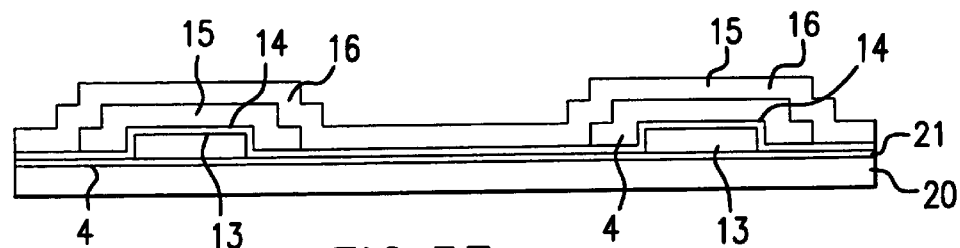

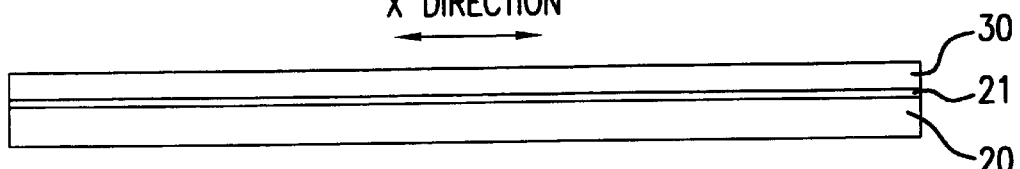
FIG.10A
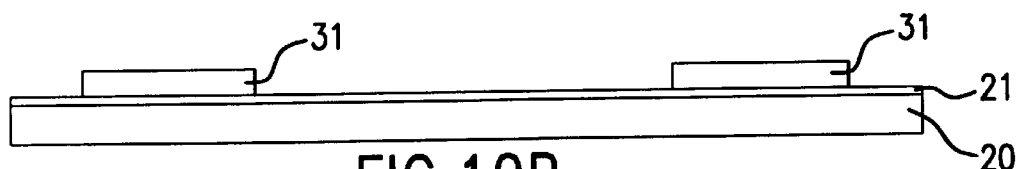
FIG.10B
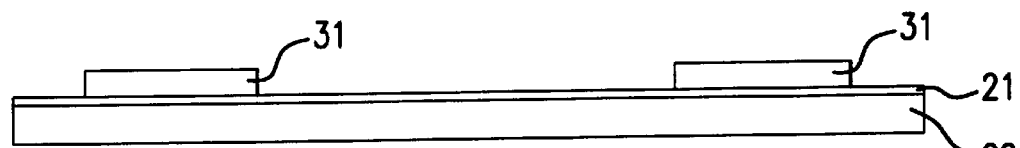
FIG.10C
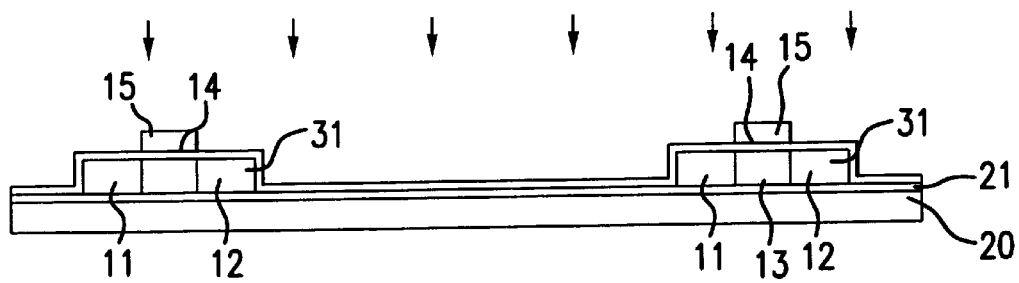
FIG.10D
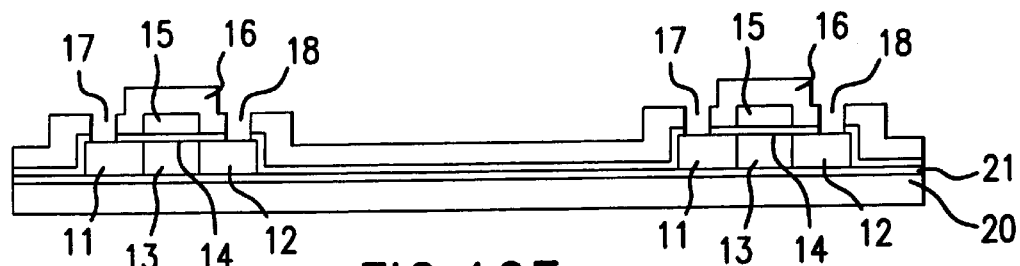
FIG.10E

ACTIVE MATRIX SUBSTRATE, METHOD OF PRODUCING AN ACTIVE MATRIX SUBSTRATE, LIQUID CRYSTAL DISPLAY DEVICE, AND ELECTRONIC EQUIPMENT This application is a National Stage of International Application No. PCT/JP96/03809, filed Dec. 26, 1996.

BACKGROUND OF THE INVENTION

1. Field of the Invention

The present invention relates to an active matrix substrate suitable for use in an active matrix liquid crystal display device and to a method of producing such an active matrix liquid crystal display device. The present invention also relates to a liquid crystal display device and electronic equipment using such an active matrix substrate. More particularly, the present invention relates to a technique of annealing a semiconductor film on a surface of a substrate so as to melt and crystalize it.

2. Description of Related Art

Semiconductor films such as polycrystalline silicon are widely used in thin film transistors (hereinafter referred to as TFTs) and solar cells. The performance of these semiconductor devices is strongly dependent on the characteristics of semiconductor films forming active regions of the semiconductor devices. In other words, if a high-quality semiconductor film is obtained, it is possible to achieve a semiconductor device having high performance corresponding to the high quality of the semiconductor film. For example, in a polysilicon thin-film transistor (TFT) used in a liquid crystal display or the like, the switching speed of the TFT becomes higher and thus its performance improves with the degree of the quality of the polysilicon film used. In the case of a solar cell, the energy conversion efficiency increases with the degree of the crystallization of a semiconductor film if the semiconductor film has a similar light absorption coefficient. Thus, it is very important in various fields of industries to obtain a semiconductor film having good crystal characteristics.

However, it is generally difficult to form a high-quality semiconductor film. Furthermore, it is required that the semiconductor film be formed under particular conditions in very limited ranges. In the case of a TFT, a transistor is fabricated using high-temperature processes whose maximum temperature is about 1000° C. so that a polysilicon film has a relatively high carrier mobility. This causes a limitation that the substrate on which a semiconductor film or semiconductor device is to be formed should have high resistance to the high-temperature processes. To meet the above requirement, polysilicon TFTs are generally produced on an expensive small-sized quartz glass substrate. For the same reason, solar cells are usually produced using amorphous silicon.

In the case of an active matrix substrate for use in a liquid crystal display device, it is desired to employ a low-cost glass substrate as the substrate on which thin film transistors (hereinafter referred to as TFTs) are formed. If a low-cost glass substrate is employed, it is required that production of TFTs on the substrate should be performed at a low temperature. Of various silicon films required to form channel and other regions of a TFT, an amorphous silicon film can be formed using a low-temperature process. However, the drawback of a TFT formed of such an amorphous silicon film is its low carrier mobility.

One technique proposed to avoid the above problem is to irradiate an amorphous silicon film formed on a glass substrate with a laser beam while moving the substrate so that the amorphous silicon film is melted and crystallized thereby obtaining a TFT with a high carrier mobility. In general, the substrate is moved relative to the laser beam so that the substrate is irradiated with a laser pulse in an overlapped fashion thereby producing a polysilicon film over a large area. This technique makes it possible to realize a TFT having a carrier mobility 10 times or greater than that of amorphous silicon.

However, in this conventional laser crystallization technique, when a substrate is irradiated with a laser beam while moving the substrate, nonuniformity occurs in the polysilicon film due to a variation of the laser power from pulse to pulse and/or due to overlapping of irradiation. Furthermore, it is required that the same area is irradiated by the laser beam at least 10 times to obtain a polysilicon film with high quality. This makes is difficult to achieve high throughput in production.

In view of the above problems, it is an object of the present invention to provide an active matrix substrate including a uniformly crystallized semiconductor film formed on a substrate. It is another object of the present invention to provide a method of producing an active matrix substrate, whereby a semiconductor film formed on a substrate can be uniformly crystallized by means of irradiation of a laser beam while achieving high throughput.

SUMMARY OF THE INVENTION

In an aspect of the present invention, to achieve the above objects, there is provided a method of producing an active matrix substrate, the active matrix substrate including: a plurality of scanning lines formed on a substrate and a plurality of data lines crossing the plurality scanning lines; a plurality of pixel regions divided by the data lines and scanning lines; and pixel electrodes and pixel thin-film transistors formed in the respective pixel regions, the method being characterized in that after forming a semiconductor film used to form the pixel thin-film transistors on the surface of the substrate, a laser annealing process is performed to melt and crystallize the semiconductor film in which the semiconductor film is irradiated by a line-shaped laser beam having an irradiation area extending a greater length in an X direction and having an optical power profile with a half-width in a Y direction smaller than the pixel pitch in the Y direction wherein the X direction is defined as the direction in which the pixel thin-film transistors are aligned in substantially straight lines and the Y direction is defined as a direction crossing the X direction.

Nonuniformity can occur in the polysilicon film annealed by the irradiation of the laser beam wherein the periodicity of the nonuniformity corresponds to the movement period of the substrate during the laser irradiation. If the width of the laser beam in the scanning direction is less than the pixel pitch, it is possible to make the periodicity of the nonuniformity at least less than the pixel pitch by scanning the laser beam across the substrate in an overlapping fashion. This allows a substantial reduction in the nonuniformity in the polysilicon film.

In the above laser annealing process according to the present invention, it is preferable that the semiconductor film be continuously melted and crystallized by moving the substrate in the Y direction relative to the line-shaped laser beam so that particular regions along the Y direction where the pixel thin-film transistors are to be formed are selectively irradiated by the line-shaped laser beam. This allows a reduction in time spent to irradiate unwanted regions and thus total laser annealing time is reduced. As a result, high throughput can be obtained while achieving good uniformity.

Furthermore, in the laser annealing process according to the present invention, it is preferable that the semiconductor film be continuously melted and crystallized by moving the substrate in the Y direction relative to the line-shaped laser beam so that particular regions along the Y direction where the pixel thin-film transistors are to be formed are selectively and repeatedly irradiated by the line-shaped laser beam.

In the present invention, the above-described laser annealing process is preferably performed before a patterning process in which the semiconductor film is patterned. This prevents an underlying protective film formed on the surface of the substrate from being damaged by the laser annealing process.

In this case, an alignment between an annealing pattern produced in the laser annealing process and a mask pattern used in the patterning process is preferably performed by using the fact that the color of the silicon film subjected to the laser annealing process varies depending on the degree of irradiation of the line-shaped laser beam. With this technique, the mask is aligned directly with the actual annealing pattern, and thus it is possible to suppress the variations in characteristics of TFTs. Furthermore, this technique makes it possible to further improve the throughput by crystallizing only channel regions.

Alternatively, the alignment between the annealing pattern produced in the laser annealing process and the mask pattern used in the patterning process on the semiconductor film may be performed by using an alignment mark produced in an underlying protective film formed under the semiconductor film.

In the present invention, the above-described laser annealing process may also be performed before the patterning process for patterning the semiconductor film.

In the present invention, it is preferable that a predetermined particular area of the substrate be coated with a photo-setting resin before the laser annealing process, and the photo-setting resin also be irradiated by the laser beam in the laser annealing process thereby curing the photo-setting resin and forming an alignment pattern used, in a subsequent process, to align a mask relative to the substrate.

Furthermore, in the present invention, the pixel thin-film transistors are preferably formed in such a manner that the channel length of each pixel thin-film transistor extends in the X direction. This prevents insufficient annealing from occurring in some portion along the channel length. As a result, it is possible to achieve high stability in the electrical characteristics of the TFTs. Furthermore, when patterning is performed after the laser annealing process, it is possible to have a large tolerance in the alignment accuracy in the direction along the channel length.

Still further, in the present invention, in the case where a driver circuit including driver thin-film transistors is formed on the substrate, in the Y-direction vicinity of an active matrix section in which the pixel regions are formed, it is preferable that the whole area, in which the driver circuit is to be formed, be annealed during the laser annealing process. This allows the semiconductor film forming TFTs to be entirely crystallized even though the TFTs in the driver circuit are not aligned.

In this case, in the laser annealing process, the speed of movement of the substrate in the Y direction relative to the line-shaped laser beam is preferably controlled so that predetermined areas of the semiconductor film are selectively annealed.

In particular, the laser annealing process is preferably performed in such a manner that when the area in which the driver circuit is to be formed is irradiated by the line-shaped laser beam, the speed of movement of the substrate in the Y direction relative to the line-shaped laser beam is set to a smaller value than when the areas in which the pixel thin-film transistors are to be formed are irradiated by the line-shaped laser beam.

This technique makes it possible to improve the carrier mobility of the TFTs forming the driver circuit while achieving high throughput.

Furthermore, in the present invention, it is preferable that an optical system be disposed in the middle of the optical path of the laser beam and the laser annealing process be performed via the optical system so that the line-shaped laser beam is converted via the optical system into a spot-shaped laser beam thereby selectively irradiating particular areas along the X direction in which the pixel thin-film transistors are to be formed. In this technique, since the optical system is disposed in the middle of the optical path of the laser beam so that the line-shaped laser beam is converted via the optical system into the spot-shaped laser beam thereby selectively irradiating particular areas along the X direction in which the pixel thin-film transistors are to be formed, no irradiation from the laser beam occurs for those parts along the X direction which are not needed to be irradiated and thus it is possible to have a corresponding increase in the intensity of the laser beam falling onto the areas which especially require irradiation.

In the annealing process according to the present invention, after performing the laser annealing process on the semiconductor film, the semiconductor film is preferably subjected to a rapid thermal annealing process. Conversely, the annealing process may also be performed in such a manner that the rapid thermal process is first performed on the semiconductor film and then the laser annealing process is performed.

In this case, it is preferable that when the substrate is being irradiated by the laser beam in the laser annealing process, the substrate is also irradiated at the same time by an optical beam for performing the rapid thermal annealing process.

In the above-described annealing process according to the present invention, it is preferable that when a certain area of the substrate is being irradiated by the laser beam in the laser annealing process, an area including the above area is irradiated at the same time by the optical beam for the rapid thermal annealing process.

The present invention will be described in further detail below with reference to embodiments in conjunction with the accompanying drawings.

BRIEF DESCRIPTION OF THE DRAWINGS

FIGS. 5(A)–(F) are cross-sectional views of the TFT of FIG. 2 taken along line 3B–3B' for various processing steps according to the first embodiment of the invention;

FIGS. 10(A)–(E) are cross-sectional views of the TFT of FIG. 2 taken along line 3A–3A' for various processing steps according to a second embodiment of the invention;

DETAILED DESCRIPTION OF THE PREFERRED EMBODIMENTS

Figure 1A:
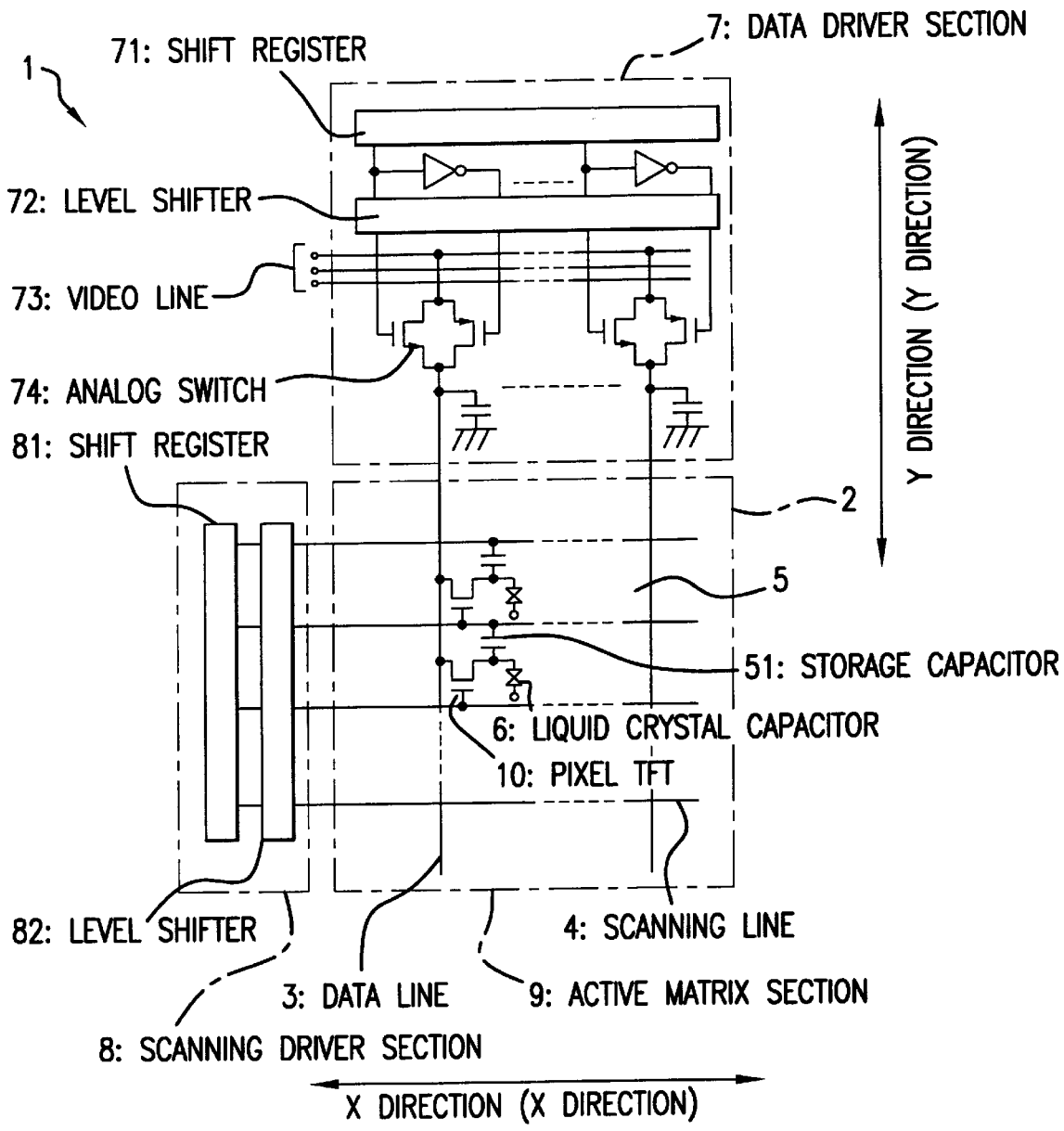
FIG. 1(A) is a schematic diagram illustrating an embodiment of an active matrix substrate used in a liquid crystal display device according to the present invention, and (B) is a circuit diagram illustrating a CMOS circuit used in a driving circuit of the active matrix substrate.

FIG. 1(A) is a schematic diagram illustrating the construction of an active matrix substrate of a liquid crystal display device.

As shown in FIG. 1(A), the liquid crystal display device 1 includes pixel areas 5 formed on an active matrix substrate 2 wherein the pixel areas 5 are separated from one another by data lines 3 and scanning lines 4. Each pixel area serves as a liquid crystal cell having a liquid crystal capacitor 6 to which an image signal is applied via a pixel TFT 10. In the following description, two crossing directions extending on the active matrix substrate 2 are defined as X and Y directions, respectively, wherein it is assumed that the scanning lines 4 extend in the X direction and the data lines 3 extend in the Y direction. In the present invention, however, the X direction is not limited to the direction defined above (the direction in which the scanning lines 4 extend) and the Y direction is not limited to the direction defined above (the direction in which the data lines 3 extend). The X direction may also be defined as the direction in which the data lines 3 extend and the Y direction may be defined as the direction in which the scanning line 4 extend.

The data lines 3 are connected to a data driver section 7 including a shift register 71, a level shifter 72, video lines 73, and analog switches 74. On the other hand, the scanning lines 4 are connected to a scanning driver section 8 including shift register 81 and a level shifter 82. In some cases, a storage capacitor 51 may be formed in each pixel area in such a manner that the storage capacitor 51 is connected to a scanning line at a preceding stage.

Figure 1B:
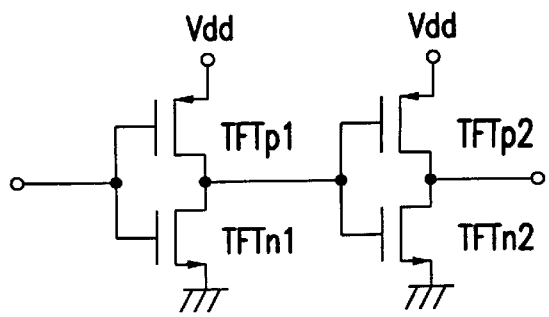

An active matrix section 9 includes the data lines 3, the scanning lines 4, the pixel areas 5, and TFTs 10, wherein the TFTs 10 are aligned in the X and Y directions. On the other hand, in the data driver section 7 there are a great number of circuit elements, for example, a CMOS circuit such as a 2-stage inverter including, as shown in FIG. 1(B), n-type TFTs n1 and n2 and p-type TFTs p1 and p1, wherein the n-type TFTs n1 and n2 and p-type TFTs p1 and p2 are not aligned in the X or Y direction, although the TFTs 10 in the active matrix section 9 and the n-type TFTs n1 and n2 and p-type TFTs p1 and p2 in the data driver section 7 are all the same in structure and produced in the same process.

The active matrix substrate 2 may be constructed in various forms. In one form, only the active matrix section 9 is constructed on a substrate. In another form, the active matrix section 9 and the data driver section 7 are constructed on the same substrate. In still another form, the active matrix section 9 and the scanning driver section 8 are constructed on the same substrate. Otherwise, in a further form, the active matrix section 9, the data driver section 7, and the scanning driver section 8 are all constructed on the same substrate. When the active matrix substrate 2 is constructed to include the built-in data driver section 7, the data driver section 7 may include all circuit elements of the data driver section 7 such as the shift register 71, the level shifter 72, the video lines 73, and the analog switches 74, or the built-in data driver section 7 may include only portions of these circuit elements. Similarly, when the active matrix substrate 2 is constructed to include both the data driver section 7 and the scanning driver section 8, the data driver section 7 and the scanning driver section 8 may include either all of these circuit elements or only portions of the circuit elements. The present invention may be applied to any of these types of active matrix substrates. In the following description, it is assumed that the active matrix substrate 2 includes the data driver section 7 disposed in the Y-direction vicinity of the active matrix section 9. Although in the specific example shown in FIG. 1(A), the data driver section 7 is disposed only in one of two Y-direction vicinities of the active matrix section 9, the active matrix substrate 2 includes, in many practical cases, two data driver sections 7 disposed at the respective Y-direction vicinities of the active matrix section 9. Thus, in the following description, it is assumed that there are two data driver sections 7 disposed at the respective Y-direction vicinities of the active matrix section 9.

Figure 2:
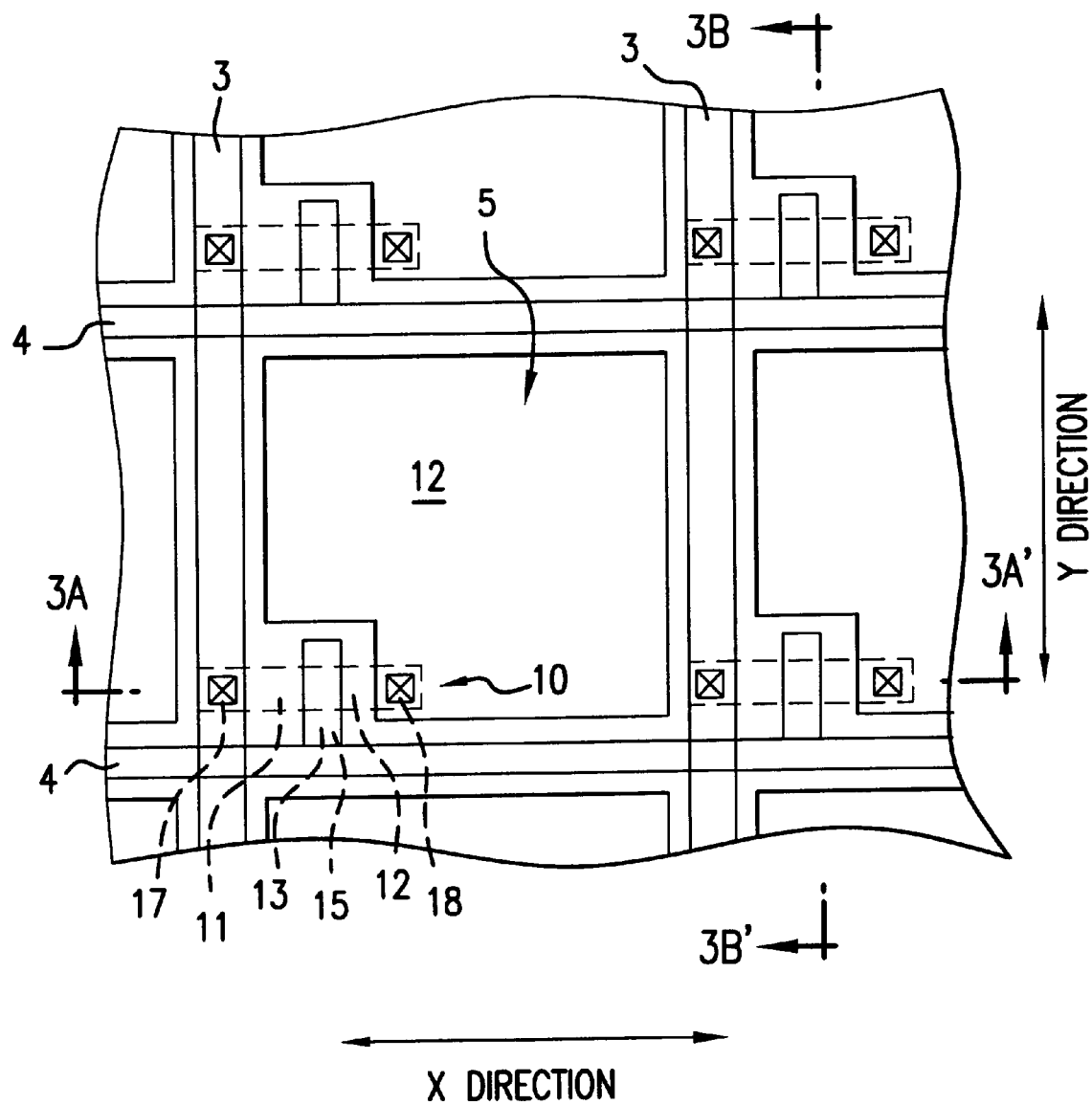
FIG. 2 is an enlarged plan view illustrating a pixel region on the active matrix substrate.
Figure 3A:
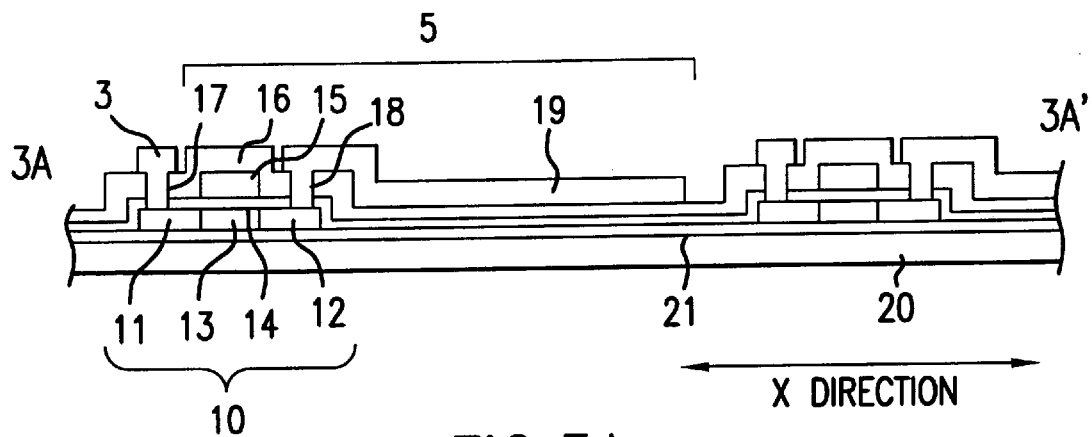
FIG. 3(A) is a cross-sectional view of FIG. 2 taken along line 3A–3A', and (B) is a cross-sectional views of FIG. 2 taken along line 3B–3B'.
Figure 3B:
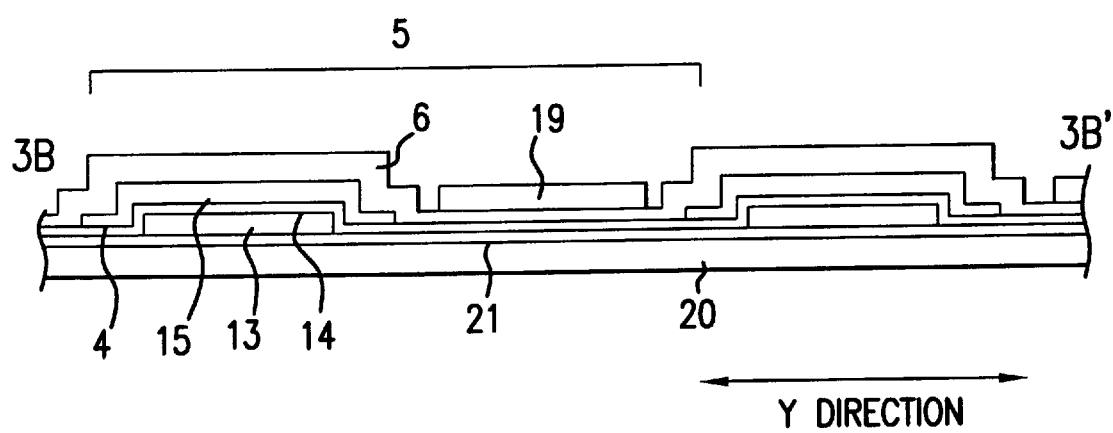

FIG. 2 is an enlarged plan view illustrating one pixel area of the active matrix substrate 2. FIG. 3(A) is a cross-sectional view of FIG. 2 taken along line 3A–3A', while FIG. 3(B) is a cross-sectional view of FIG. 2 taken along line 3B–3B'. TFTs in the data driver section also have basically the same structure as those described above, and thus they are not described in further detail herein.

In these figures, each pixel area 5 has a TFT 10 formed on a glass substrate 20, wherein the TFT includes: a source region 11 electrically connected to the data line 3 via a contact hole 17 formed in an interlayer insulating film 16; a drain region 12 electrically connected to a pixel electrode 19 via a contact hole 18 formed in the interlayer insulating film 16; a channel region 13 formed between the drain region 12 and the source region 11; and a gate electrode 15 disposed above the channel region 13 via a gate insulating film 14. The gate electrode 15 is formed as a part of the scanning line 4. On the surface of the glass substrate 20, there is provided an underlying protective film 21 made of a silicon nitride film, a silicon oxide film, or a similar material.

The TFT 10 may be placed in various locations. For example, the TFT 10 may be placed at the same location in each pixel area 5 or placed such that two neighboring pixel areas 5 are symmetrical in terms of the location of the TFT 10. In many cases, TFTs 10 are aligned either in the X direction or in the Y direction. In this embodiment, TFTs are produced using the production method described below, which takes advantage of the feature that the TFTs are aligned.

Referring to the figures, a method of producing a TFT according to a first embodiment of the invention will be described below.

In this embodiment, a 235 mm square alkali-free glass plate is employed as the substrate, and TFTs are produced thereon as described below.

FIG. 4 is a cross-sectional view of the TFT of FIG. 2 taken along line 3A–3A' for various processing steps. FIG. 5 is a cross-sectional view of the TFT of FIG. 2 taken along line 3B–3B' for various processing steps. The TFTs in the data driver section are produced at the same time via the same processing steps, and thus further description about the process for these TFTs will not be given here.

Figure 4A:
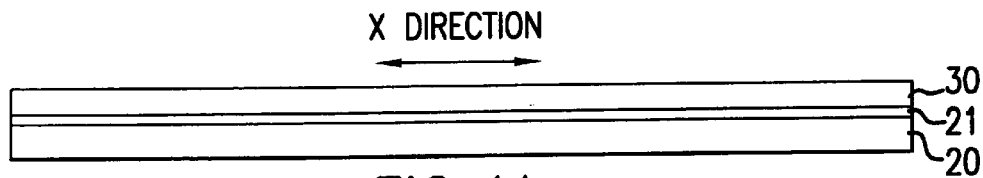
FIGS. 4(A)–(E) are cross-sectional views of the TFT of FIG. 2 taken along line 3A–3A' for various processing steps according to a first embodiment of the invention.

Referring to FIG. 4(A) and FIG. 5(A), in the case where a silicon oxide film is employed as the underlying protective film 21, the silicon oxide film having a thickness in the range from 500 Å to 2000 Å is formed on the surface of the glass substrate 20 by means of an ECR-PECVD technique at a temperature in a range from 250° C. to 300° C. The silicon oxide film may also be formed by means of an APCVD technique. In this case, monosilane ($SiH_4$) and oxygen serving as source gases are supplied to the surface of the substrate 20 maintained at a temperature in a range from 250° C. to 450° C. thereby forming a silicon oxide film on the substrate 20.

An undoped intrinsic silicon film (semiconductor film) 30 with a thickness in a range from 200 Å to 1000 Å is then formed on the surface of the underlying protective film 21. The formation of the silicon film 30 may be accomplished for example by the LPCVD, PECVD, or sputtering technique. When one of these techniques is employed, the silicon film 30 may be formed at a temperature in a range from room temperature to about 500° C.

Figure 4B:
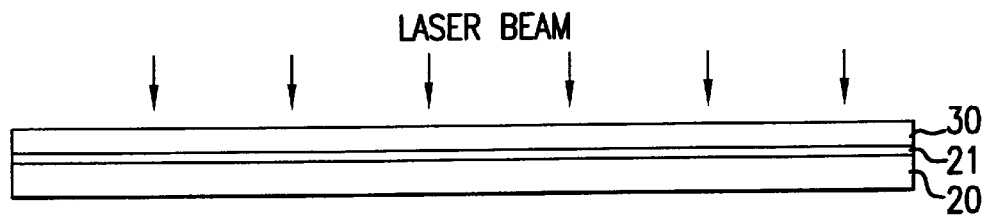

Then, as shown in FIG. 4(B), FIGS. 5(B), and (C), the silicon film 30 in an amorphous form is irradiated by a laser beam so as to convert the silicon film 30 into a polycrystalline form. An excimer laser is widely used for this purpose. In this embodiment, a xenon chloride (XeCl) excimer laser (with a wavelength of 308 nm) is employed in the laser annealing process. In this annealing process, the glass substrate 20 is irradiated by the laser beam in an environment such as a vacuum, inert gas, or oxygen, while maintaining the glass substrate 20 at room temperature or heating it at an appropriate temperature below 500° C.

Figure 6:
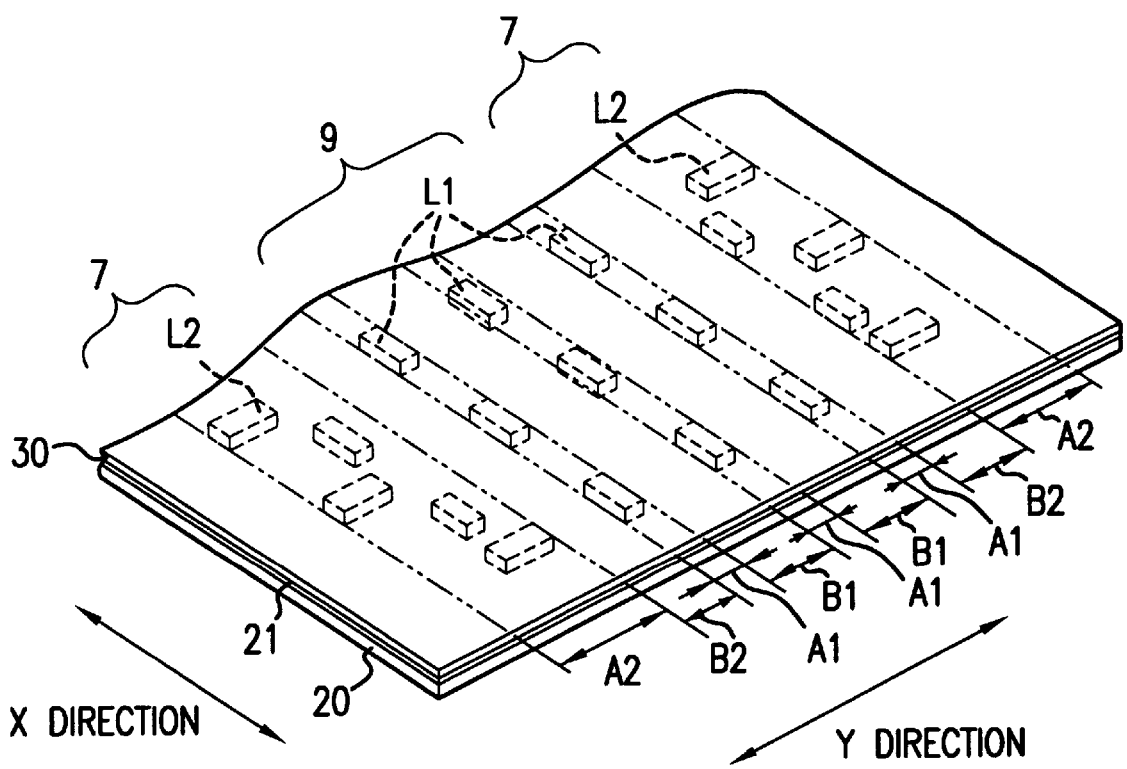
FIG. 6 is a schematic diagram illustrating particular regions of a silicon film which are required to be laser-annealed according to the first embodiment of the invention.

Before the annealing process is performed (at the process stage shown in FIG. 4(A) or FIG. 5(A)), the underlying protective film 21 and the silicon film 30 are formed over the entire surface of the glass substrate 20 as shown in FIG. 6 wherein only the portions of the silicon film 30, represented by broken lines L1 in FIG. 6, will serve as the source regions 11, drain regions 12, and channel regions 13 of the respective TFTs 10 in the active matrix section 9, and only the portions of the silicon film 30 represented by broken lines L2 in FIG. 6 will serve as the source regions 11, drain regions 12, and channel regions 13 of the respective TFTs 10 in the data driver section 7.

Therefore, in this embodiment, when the active matrix section 9 shown in FIG. 6 is subjected to the laser annealing process, the irradiation of the laser beam onto the silicon film 30 along the Y direction is controlled so that only those regions A1 in which TFTs 10 will be formed are selectively irradiated by the laser beam and those regions B2 between the regions A1 for the TFTs 10 are not subjected to intentional irradiation of the laser beam.

On the glass substrate 20, the data driver section 7 including similar TFTs 10 will be formed in the Y-direction vicinity of the active matrix section 9. In this data driver section 7, to place a great number of TFTs 10 in a limited area, particularly such a small area, the regions in which TFTs 10 will be formed are not simply aligned in a straight line along the X direction as represented by broken lines L2, as opposed to the active matrix section 9. Therefore, in the data driver section 7, it is impossible to selectively irradiate only those regions in which TFTs 10 will be formed by the laser beam and thus all the areas A2 in the data driver sections 7 are irradiated by the laser beam. The regions B2 between the active matrix section 9 and the data driver sections 7 are not subjected to intentional laser irradiation.

Figure 7A:
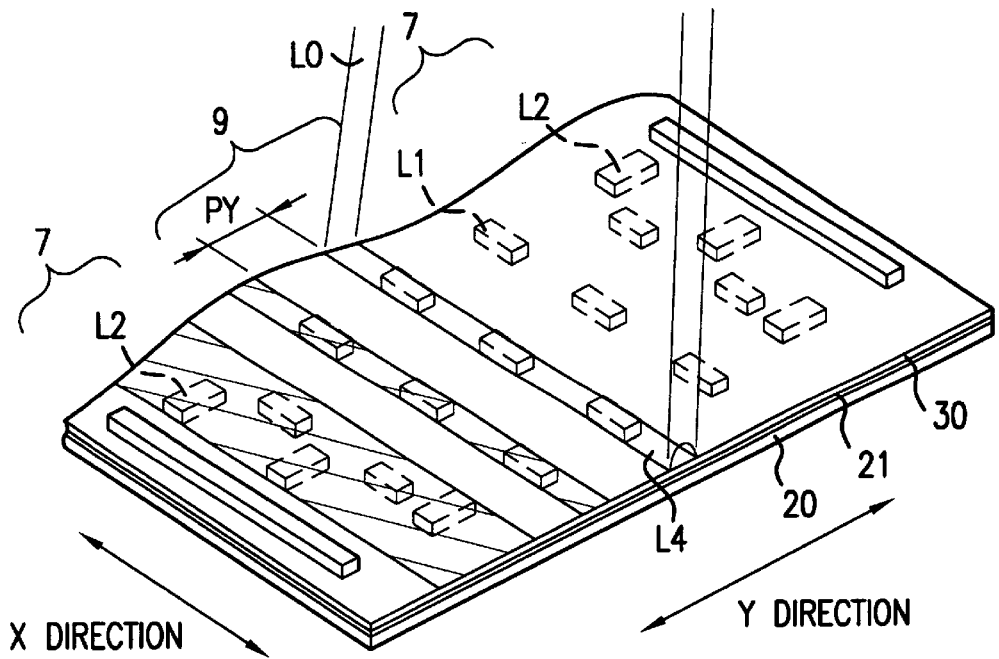
FIG. 7(A) is a schematic diagram illustrating an annealing process by means of irradiation of a laser beam according to the first embodiment of the invention, (B) illustrates the intensity profile of the laser beam in the Y direction, and (C) illustrates another intensity profile of laser beam in the Y direction.
Figure 7B:
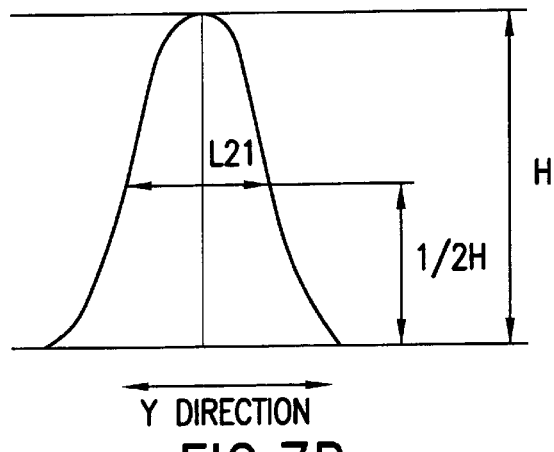
Figure 7C:
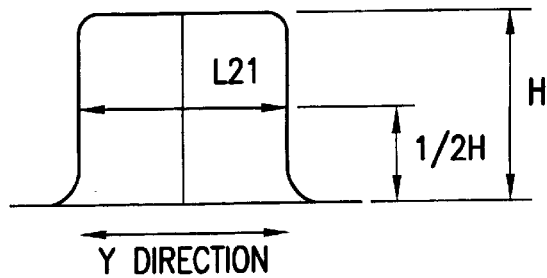

In the present embodiment, as can be seen from FIG. 7(A), the silicon film 30 is irradiated by a line-shaped laser beam L0 having an irradiation area L4 extending a greater length in the X direction and having an optical power profile with a half-width in the Y direction smaller than the pixel pitch in the Y direction (wherein the laser pulse repetition frequency is selected at a value in a range from 100 to 1000 Hz, and more preferably 200 Hz). That is, as shown in FIG. 7(B), when the optical power profile of the line-shaped laser beam is defined by the optical power represented in the vertical axis as a function of the location in the Y direction across the irradiation region L4, the half-width L21 (defined as the width where the optical power falls to half the peak value H) of the line-shaped laser beam is set to a value less than the pixel pitch PY in the Y direction. Because the output power of a laser generator is limited, it is important to properly shape the laser beam to form a uniform polysilicon film in a highly efficient manner. In the present invention, to meet the above requirement, the width of the laser beam in the Y direction is set to as small a value as possible, while the width in the X direction is set to as great a value as possible so that high throughput as well as good uniformity can be achieved. The spatial distribution of the degree of crystallization of the silicon film crystallized by irradiation of the laser beam depends on both the power profile of the line-shaped laser beam LO and the overlapping ratio of irradiation. If the half-width L21 of the laser beam is greater than the pixel pitch PY as is the case with the conventional technique, the periodicity of the degree of crystallization is always greater than the pixel pitch PY. On the other hand, if a laser beam having a half-width L21 smaller than the pixel pitch PY is employed and irradiation is performed in an overlapped fashion, it is possible to control the distribution of the degree of crystallization so that the periodicity of the crystallization becomes less than the pixel pitch PY. This allows a great reduction in characteristic variations among TFTs. When the laser beam has an optical power profile which is not a Gaussian distribution but has a flat distribution with a height equal to the maximum value H over a particular area as shown in FIG. 7(C), the half-width L21 is also defined by the width where the optical power falls to half the peak value H.

Figure 8A:
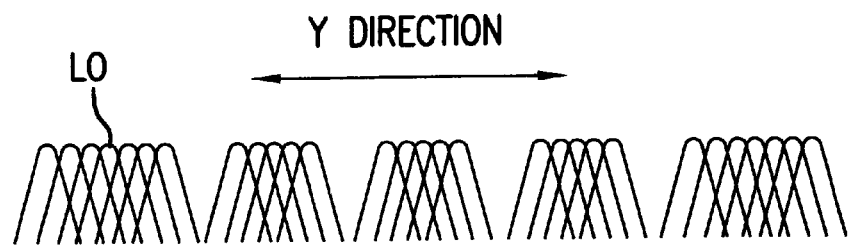
FIG. 8(A) is a schematic representation of selective irradiation of the laser beam in the annealing process according to the first embodiment of the invention, and (B) is a schematic representation of the travel speed of a substrate during the annealing process.

In the present embodiment, when the silicon film 30 is annealed using the line-shaped laser beam LO in the above-described form, the position of the line-shaped laser beam LO is fixed while the glass substrate 20 is carried by a stage 40 so that it moves in the Y direction as shown in FIG. 8(A) thereby continuously melting and crystallizing the silicon film 30. In this annealing process, because the line-shaped laser beam has an optical power profile in the Y direction across the irradiation region L4 with a half-width L21 less than the pixel pitch PY, the regions B1 which do not need annealing are not substantially irradiated by the line-shaped laser beam LO when the regions A1, in which TFTs 10 will be formed, are irradiated by the line-shaped laser beam LO.

Figure 8B:
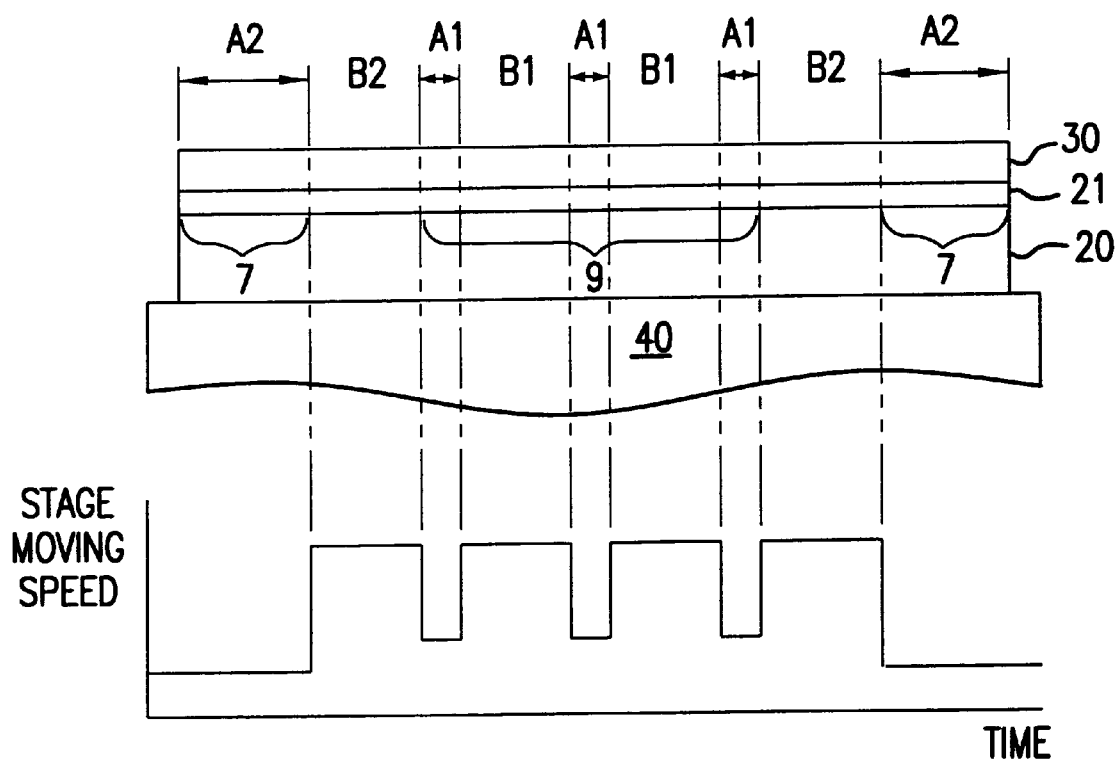

As shown in FIG. 8(B), the stage 40 is moved at a low speed when the regions A2 for the data driver section 7 are irradiated by the line-shaped laser beam LO. However, the stage 40 is moved at a high speed when the line-shaped laser beam LO strikes the region B2 between the data driver section 7 and the region in which TFTs 10 will be formed. The stage 40 may be moved at the same speed for both the regions A2 in which the data driver section 7 will be formed and regions A1 in which TFTs 10 will be formed. When the regions A1 in which TFTs 10 will be formed are irradiated by the line-shaped laser beam LO, the stage 40 is moved at a low speed, while the stage 40 is moved at a high speed when the line-shaped laser beam strikes regions B1 between adjacent regions in which TFTs 10 will be formed. As a result, only those regions of the silicon film 30 subjected to long-time irradiation of the line-shaped laser beam LO are selectively melted and crystallized into the form of polycrystalline silicon.

In the above annealing process, the line-shaped laser beam LO selectively and repeatedly strikes the regions A2 in which the data driver sections 7 are to be formed and the regions A1 in which the TFTs 10 of the active matrix section 9 are to be formed, and thus the silicon film 30 in the regions A2 for the data driver sections 7 and the regions A1 for the TFTs 10 of the active matrix section 9 is converted into a high-quality polysilicon film while achieving an improved throughput. In particular, the TFTs 10 in the data driver sections 7 are required to operate at a high speed. To meet the above requirement, when the regions A2 for the data driver sections 7 are irradiated by the line-shaped laser beam LO, as shown in FIG. 8(B), the stage 40 is moved at a speed as low as possible or the regions A2 for the data driver sections 7 are irradiated an increased number of times by the line-shaped laser beam LO. In the case where the TFT 10 to be formed in a particular region A1 does not need a high carrier mobility, the region A1 may be irradiated by the laser beam only once.

Figure 4C:
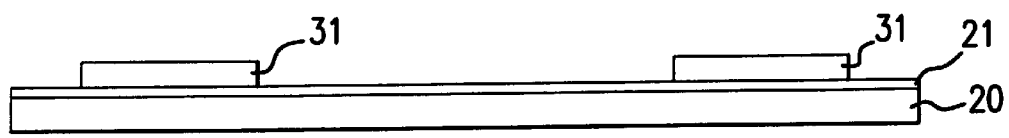
Figure 9:
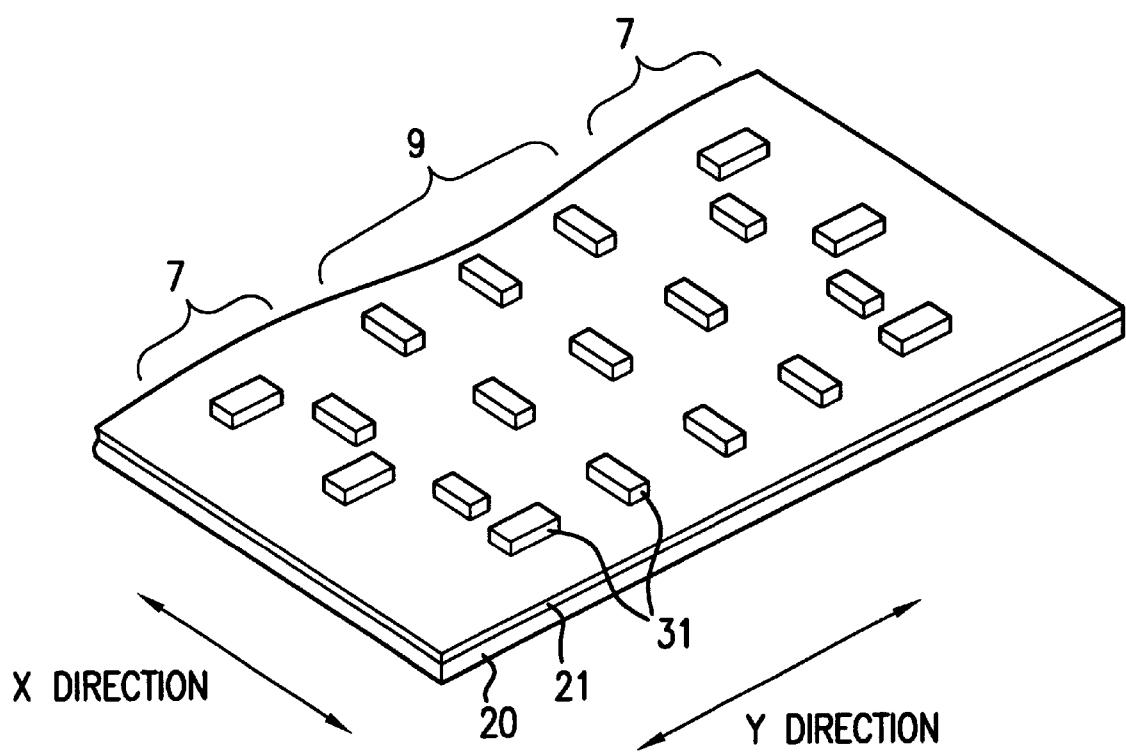
FIG. 9 is a schematic diagram illustrating the silicon film patterned after the annealing process according to the first embodiment of the invention.

After the annealing process, the silicon film 30 is patterned using a photolithography technique so as to form islands 31 of the silicon film as shown in FIG. 4(C), FIG. 5(D), and FIG. 9. In this patterning process, the alignment between a mask pattern used in the patterning process and an annealing pattern generated by the laser annealing process performed on the silicon film 30 is performed using the color of the silicon film 30 subjected to the laser annealing which varies depending on the degree of the irradiation of the laser beam LO. That is, those regions of the silicon film 30 which are not irradiated by the laser beam LO and thus remain in the form of amorphous silicon are red, while those regions of the silicon film 30 which have been converted into the polycrystalline form by irradiation of the laser beam LO are yellow. The boundary between a red and yellow regions is used as a reference line by which the mask pattern for the above patterning is aligned relative to the annealing pattern of the silicon film 30. If laser annealing is performed at spatial intervals corresponding to the pixel pitch PY in the Y direction, the mask alignment can be properly performed with respect to the annealing alignment pattern so that pixel TFTs with small variations can be formed with high throughput.

Figure 4D:
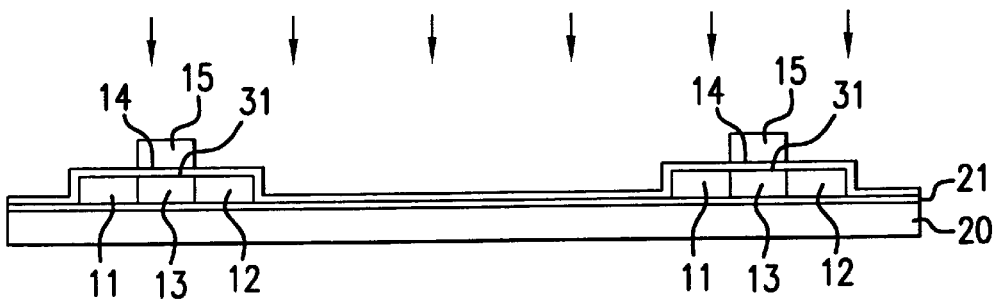

Then, as shown in FIG. 4(D) and FIG. 5(E), a silicon oxide film having a thickness in a range from 600 Å to 1200 Å is formed at a temperature in a range from 250° C. to 300° C. by means of for example ECR-PECVD thereby forming the oxide gate insulating film 14 over the silicon film islands 31.

A thin tantalum film with a thickness in a range from 3000 Å to 6000 Å is then deposited on the surface of the oxide gate insulating film 14 by means of sputtering. The thin tantalum film is then patterned using a photolithography technique so as to form the gate electrodes 15.

With a bucket-type non-mass-separation ion implanting apparatus (ion doping apparatus), impurity ions are then implanted into the silicon film islands 31 using the gate electrode 15 as a mask so that source regions 11 and drain regions 12 are formed at self-aligned positions relative to the corresponding gate electrodes 15. The regions of the silicon film islands 31 where no impurity ions are implanted become channel regions 13. In the specific example described above, the source and drain regions are formed in a self-aligned fashion by performing ion implantation using the gate electrode as a mask. However, the source and drain regions may also be formed in different fashions. For example, the source and drain regions may be formed into a LDD structure with low impurity concentration regions or into an offset structure by performing ion implantation using a mask covering the gate electrode.

In the case where p-channel TFTs are formed, 5% diborane ($B_2H_6$) diluted with hydrogen gas may be used as the source gas.

Then, as shown in FIG. 4 (E) and FIG. 5(F), a silicon oxide film serving as the interlayer insulating film 16 with a thickness of 5000 Å is deposited by means of PECVD at a temperature in a range from 250° C. to 300° C. In this process, TEOS ($Si-(O-CH_2-CH_3)_4$) and oxygen are used as source gases and the film deposition is performed while maintaining the substrate at a temperature in a range from 250° C. to 300° C.

Heat treatment is then performed in an oxygen atmosphere at 300° C. for 1 hour so as to activate the implanted phosphorus ions and also to improve the quality of the interlayer insulating film 16.

Contact holes 17 and 18 are then formed in the interlayer insulating film 16. After that, via these contact holes 17 and 18, source electrodes (data lines 3) are electrically connected to the corresponding source regions 11 and drain electrodes (pixel electrodes 19) are electrically connected to the corresponding drain regions 12 thereby forming TFTs 10.

In the method of producing an active matrix substrate according to the present embodiment, as described above, the laser annealing process is performed in such a manner that the areas A1, in which pixel TFTs 10 will be formed along the X direction, are irradiated by the line-shaped laser beam LO having an irradiation area extending a greater length in the X direction and having an optical power profile with a half-width in the Y direction smaller than the pixel pitch in the Y direction. That is, laser annealing is performed with the line-shaped laser beam in an overlapping fashion so that the polycrystalline silicon has periodicity in the crystallinity less than the pixel pitch thereby achieving better uniformity. Furthermore, since the laser irradiation area is limited to only those regions in which TFTs are to be formed, it is possible to achieve high throughput.

Furthermore, in the present embodiment, as shown in FIGS. 8(A) and (B), during the operation of continuously melting and crystallizing the silicon film 30 by moving the glass substrate 20 relative to the line-shaped laser beam LO in the Y direction, the stage 40 is moved at a low speed when the line-shaped laser beam LO strikes the regions A1 and A2 in which TFTs 10 or the data driver sections 7 are to be formed, while the stage 40 is moved at a high speed when the line-shaped laser beam LO strikes the other regions. This allows a reduction in time spent to irradiate unwanted regions and thus total laser annealing time is reduced. As a result, throughput is improved.

Although, in the active matrix section 9, the TFTs 10 are located in straight lines in the X direction, the TFTs 10 in the data driver sections 7 are not located in straight lines. Nevertheless, in the present embodiment, the while region for the data driver section 7 is subjected to the laser annealing process so that the TFTs 10 in the data driver sections 7 are produced of the silicon film 30 annealed into the polycrystalline form and thus the TFTs 10 in the data driver sections 7 also have a high carrier mobility. The laser annealing process according to the present embodiment may also be employed when the active matrix substrate includes a data driver section or portions thereof.

The channel region 13 of each TFT 10 is constructed such that the channel length extends in the X direction which is the same direction as the direction of the longer length of the line-shaped laser beam. This prevents insufficient annealing from occurring in some portions of the channel region 13 between the source region 11 and the drain region 12. As a result, it is possible to achieve high stability in the electrical characteristics of the TFTs 10. Furthermore, when patterning is performed after the laser annealing process, it is possible to have a large tolerance in the alignment accuracy in the direction along the channel length without resulting in large variations in the electrical characteristics of the TFTs 10.

Furthermore, because the patterning process is performed after completion of the laser annealing process, the underlying protective film 21 is not exposed to direct irradiation of the laser beam. This prevents the underlying protective film 21 from being damaged. After completion of the laser annealing process, the silicon film 30 has a color that varies depending on the degree of irradiation of the laser beam. The difference in the color makes it possible to detect the annealing pattern created by the laser annealing process. Therefore, in the patterning process, it is possible to perform alignment of the mask pattern relative to the annealing pattern created by the laser annealing process without having any problems. As a result of the above manner of the alignment, the patterning is performed relative to the actual annealing pattern, and thus it is possible to achieve high alignment accuracy. Furthermore, in the case where the channel regions 13 are aligned in the Y direction as is the case in the present embodiment, the above feature of high alignment accuracy makes it possible to irradiate only channel regions using a line-shaped laser beam having an irradiation area extending a longer length in the Y direction. In this case, the throughput is further improved.

Referring to the drawings, a method of producing a TFT according to a first embodiment of the invention will be described below.

In this embodiment, a 300 mm square alkali-free glass plate is employed as a substrate, and TFTs are produced thereon as described below.

First, as shown in FIG. 4(A) and FIG. 5(A), a silicon oxide film serving as an underlying protective film 21 with a thickness of 2000 Å is formed on the surface of the glass substrate 20 by means of an ECR-PECVD technique at a temperature of 300° C.

An undoped intrinsic silicon film (semiconductor film) 30 with a thickness of 500 Å is then deposited on the surface of the underlying protective film 21. In this embodiment, the deposition of the silicon film 30 is performed at 425° C. using a high-vacuum LPCVD apparatus while supplying disilane ($Si_2H_6$) serving as a source gas into the apparatus at a flow rate of 200 SCCM thereby forming an amorphous silicon film. In this deposition process, the substrate is placed in the reaction chamber of the high-vacuum LPCVD apparatus, and the temperature inside the reaction chamber is maintained at 250° C. Then a turbo molecular pump is operated. After the rotation of the turbo molecular pump has reached a steady state, the temperature inside the reaction chamber is raised from 250° C. to a deposition temperature of 425° C. at a rate which results in a total rising time of 1 hour. For a first period of 10 min after the start of temperature rising, the temperature is raised in a vacuum without supplying any gas into the reaction chamber. After that, nitrogen gas with purity higher than 99.9999% is continuously supplied into the reaction chamber at a flow rate of 300 SCCM. When the temperature has reached the deposition temperature, disilane ($Si_2H_6$) serving as the source gas is supplied at a flow rate of 200 SCCM together with 1000 SCCM helium (He) with purity higher than 99.9999% serving as a diluent. In this way, an amorphous silicon film with a desired thickness is formed in 2–3 hours.

Then, as shown in FIG. 4(B), FIGS. 5(B) and (C), the amorphous silicon film 30 is irradiated by a laser beam so as to convert the silicon film 30 into a polycrystalline form. In this embodiment, a xenon chloride (XeCl) excimer laser (wavelength of 308 nm) is employed in the laser annealing process. The laser beam used in the irradiation process is shaped in such a manner that the laser-irradiated area L4 extends a longer length in the X direction and such that the cross section in the Y direction has a shape near Gaussian distribution as shown in FIG. 7(B). That is, when the optical power profile of the line-shaped laser beam is defined by the optical power represented in the vertical axis as a function of the location in the Y direction across the irradiation region L4, as shown in FIG. 7(B), the half-width L21 (defined as the width where the optical power falls to half the peak value H) of the line-shaped laser beam used to irradiated the silicon film 30 is set to a value less than the pixel pitch PY in the Y direction. The above laser irradiation process is performed in an oxygen atmosphere at room temperature.

The laser irradiation is performed in an overlapping fashion using a laser beam having a half-width L21 smaller than the pixel pitch PY so that the distribution of the degree of crystallization is controlled such that the degree of crystallization has periodicity less than the pixel pitch PY. This allows a large reduction in characteristic variations among TFTs. More specifically, in the present embodiment, if the pixel pitch is less than 75 mm, the shape of the line-shaped laser beam is adjusted to have a half-width equal to or less than 50 mm.

In the present embodiment, when the active matrix section 9 shown in FIG. 6 is subjected to the laser annealing process, the irradiation of the laser beam onto the silicon film 30 along the Y direction is controlled so that only those regions A1 in which TFTs 10 will be formed are selectively irradiated by the laser beam and those regions B1 between the regions A1 in which TFTs 10 will be formed are not subjected to intentional irradiation of the laser beam. On the glass substrate 20, the data driver sections 7 including similar TFTs 10 will be formed in the Y-direction vicinities of the active matrix section 9. When these areas A2 for the data driver sections 7 are subjected to the laser annealing process, the entire areas A2 are irradiated by the laser beam. The regions B2 between the active matrix section 9 and the data driver sections 7 are not subjected to intentional laser irradiation.

In the present embodiment, when the silicon film 30 is annealed using the line-shaped laser beam LO in the form described above, the position of the line-shaped laser beam LO is fixed while the substrate 20 is carried by the stage 40 so that it moves in the Y direction as shown in FIG. 8(A) thereby continuously melting and crystallizing the silicon film 30. In this annealing process, the line-shaped laser beam LO has an optical power profile across the irradiation area L4 with a half-width L21 in the Y direction less than the pixel pitch PY, for example about 50 mm for a pixel pitch of 75 mm, and thus regions B1 which do not require annealing are not substantially irradiated by the line-shaped laser beam LO when the line-shaped laser beam LO is striking regions A1 in which TFTs 10 will be formed.

As shown in FIG. 8(B), the stage 40 is moved at a low speed when a region A2 for a data driver section 7 is irradiated by the line-shaped laser beam LO. However, the stage 40 is moved at a high speed when the line-shaped laser beam LO strikes a region B2 between the data driver section 7 and the region in which TFTs 10 will be formed. When regions A1 in which TFTs 10 will be formed are irradiated by the line-shaped laser beam LO, the stage 40 is moved at a low speed, while the stage 40 is moved at a high speed when the line-shaped laser beam strikes the region B1 between adjacent regions in which TFTs 10 will be formed. More specifically, the moving speed of the stage 40 is controlled so that the same portion of each area A2 is irradiated by the laser beam 10 to 20 times and the same portion of each area A1 is irradiated 5 to 10 times. In the above laser irradiation process, the peak energy density of the line-shaped laser beam is set to 100 to 400 mJ/cm$^2$ and more preferably 200 to 300 mJ/cm$^2$, and the moving speed of the stage for the areas A2 is set to 0.5 mm/sec so that these areas are irradiated by the laser beam 10 to 20 times, while the moving speed of the stage for the areas A1 is set to 1 mm/sec so that these areas are irradiated by the laser beam 5 to 10 times. If the laser irradiation is performed under the conditions described above, it is possible to control the carrier mobility of transistors such that the transistors in pixel regions will have a carrier mobility in a range from 25 to 45 cm$^2$/Vxsec and the transistors in the data driver sections will have a carrier mobility in a range from 80 to 120 cm$^2$/Vxsec. On the other hand, in the regions B2, the stage 40 is preferably moved at a speed of 1 cm/sec. The stage speed for the respective regions may be controlled within the ranges described above depending on the desired characteristics of TFTs. In the above laser irradiation process, the line-shaped laser beam LO selectively and repeatedly strikes the regions A2 in which the data driver sections 7 are to be formed and the regions A1 in which the TFTs 10 of the active matrix section 9 are to be formed, and thus a high-quality polysilicon film is produced while achieving an improved throughput. In particular, the regions for the data driver sections 7 are irradiated a greater number of times so that a higher-quality polysilicon film can be obtained.

After the annealing process, the silicon film 30 is patterned using a photolithography technique so as to form the islands 31 of the silicon film 30 as shown in FIG. 4(C), FIG. 5(D), and FIG. 9. In this patterning process, the alignment between a mask pattern used in the patterning process and an annealing pattern generated by the laser annealing process performed on the silicon film 30 is performed using the color of the silicon film 30 subjected to the laser annealing which varies depending on the degree of the irradiation of the laser beam LO.

Then, as shown in FIG. 4(D) and FIG. 5(E), an oxide silicon film having a thickness of 1200 Å is formed at 300° C. by means of ECR-PECVD thereby forming an oxide gate insulating film 14 over the silicon film islands 31.

A thin tantalum film with a thickness of 6000 Å is then deposited on the surface of the oxide gate insulating film 14 by means of sputtering. The thin tantalum film is then patterned using a photolithography technique so as to form the gate electrodes 15. In the present embodiment, the process of forming the thin tantalum film is performed using argon gas including 6.7% nitrogen as a sputtering gas while maintaining the substrate at 180° C. The thin tantalum film formed in the above-described manner will have an a crystal structure and a resistivity of 40 mWcm. The thin tantalum film may also be formed by means of the CVD technique or similar techniques.

With a bucket-type non-mass-separation ion implanting apparatus (ion doping apparatus), impurity ions are then implanted into the silicon film islands 31 using the gate electrode 15 as a mask so that source regions 11 and drain regions 12 are formed at self-aligned positions relative to the gate electrodes 15. The regions of the silicon film islands 31 where no impurity ions are implanted become channel regions 13. In the present embodiment, the ion implantation process is performed using 5% phosphine (PH$_3$) diluted with hydrogen as the source gas with an acceleration voltage of 100 KeV so that the total dose becomes 1×10$^{16}$ ions cm$^{-2}$.

In the case where p-channel TFTs are formed, 5% diborane (B$_2$H$_6$) diluted with hydrogen gas may be used as the source gas.

Figure 4E:
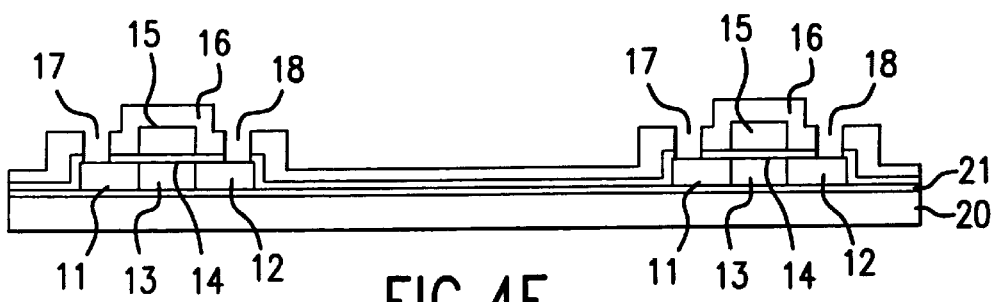

Then, as shown in FIG. 4(E) and FIG. 5(F), a silicon oxide film serving as the interlayer insulating film 16 with a thickness of 5000 Å is deposited at 300° C. by means of PECVD. In this process, TEOS (Si—(O—CH$_2$—CH$_3$)$_4$) and oxygen are used as source gases.

Heat treatment is then performed in an oxygen environment at 300° C. for 1 hour so as to activate the implanted phosphorus ions and also to improve the quality of the interlayer insulating film 16.

The contact holes 17 and 18 are then formed in the interlayer insulating film 16. After that, via these contact holes 17 and 18, source electrodes (data lines 3) are electrically connected to the corresponding source regions 11 and drain electrodes (pixel electrodes 19) are electrically connected to the corresponding drain regions 12 thereby forming TFTs 10.

TFTs according to this second embodiment may also be used as TFTs 10 in pixel regions and driver sections formed on an active matrix substrate of a liquid crystal display device such as that shown in FIG. 1(A). The TFTs according to this embodiment has the structure shown in FIG. 2, FIGS. 3(A), and (B). Therefore, similar parts or elements are represented by similar reference numerals and the structure will be not described in further detail here, although the method of producing TFTs 10 according to the present embodiment will be described below with reference to FIG. 10 and FIG. 11.

FIG. 10 is a cross-sectional view of the TFT of FIG. 2 taken along line 3A–3A' for various processing steps, and FIG. 11 is a cross-sectional view of the TFT of FIG. 2 taken along line 3B–3B' for various processing steps. TFTs in the data driver section also have basically the same structure, and thus there is no additional figure showing their structure.

Also in this second embodiment, pixel TFTs 10 are formed on an active matrix substrate 2 in respective pixel regions 5 divided by data lines 3 and scanning lines 4 wherein these TFTs 10 are arranged in straight lines along the X direction in the active matrix section 9. Furthermore, as in the first embodiment, there are also two data driver sections 7 disposed in both Y-direction vicinities of the active matrix section 9.

The second embodiment for producing TFTs 10 on the active matrix substrate 2 differs from the first embodiment in that the laser annealing process is performed after patterning an amorphous silicon film.

Figure 11A:
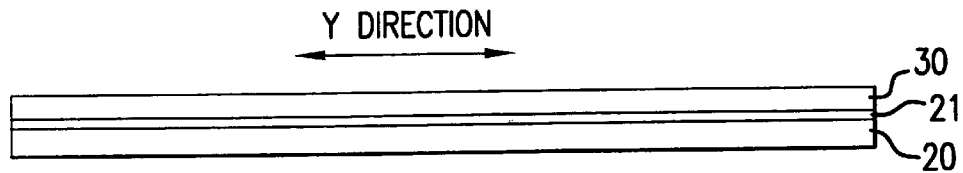
FIGS. 11(A)–(F) are cross-sectional views of the TFT of FIG. 2 taken along line 3B–3B' for various processing steps according to the second embodiment of the invention.

First, as shown in FIG. 10(A) and FIG. 11(A), a silicon oxide film serving as the underlying protective film 21 with a thickness of 2000 Å is deposited on the surface of the glass substrate 20 at 300° C. by means of ECR-PECVD.

An intrinsic silicon film 30 (semiconductor film) having a thickness of about 600 Å doped with no impurities is then deposited on the surface of the underlying protective film 21. In this embodiment, the deposition of the silicon film 30 in the amorphous form is performed at 425° C. using a high-vacuum LPCVD apparatus while supplying disilane ($Si_2H_6$) serving as a source gas into the apparatus at a flow rate of 200 SCCM. In this deposition process, the substrate is placed in the reaction chamber of the high-vacuum LPCVD apparatus, and the temperature inside the reaction chamber is maintained at 250° C. Then a turbo molecular pump is operated. After the rotation of the turbo molecular pump has reached a steady state, the temperature inside the reaction chamber is raised from 250° C. to a deposition temperature of 425° C. at a rate which results in a total rising time of 1 hour. For a first period of 10 min after the start of temperature rising, the temperature is raised in a vacuum without supplying any gas into the reaction chamber. After that, nitrogen gas with purity higher than 99.9999% is continuously supplied into the reaction chamber at a flow rate of 300 SCCM. When the temperature has reached the deposition temperature, disilane ($Si_2H_6$) serving as the source gas is supplied at a flow rate of 200 SCCM together with 1000 SCCM helium (He) with purity higher than 99.9999% serving as a diluent.

Figure 11B:
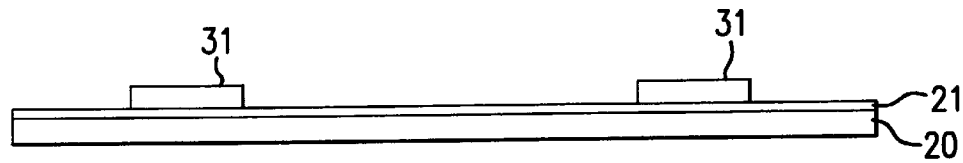
Figure 11C:
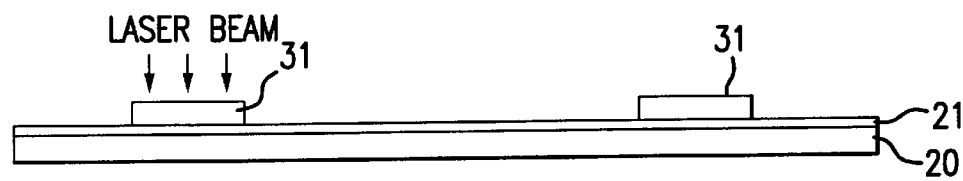
Figure 11D:

The silicon film 30 is then patterned using a photolithography technique so as to form the islands 31 of the silicon film as shown in FIG. 10(B) and FIG. 11(B).

Then, as shown in FIG. 10(C), FIGS. 1(C) and (D), the silicon film 30 in the amorphous form is irradiated by the laser beam so as to convert the silicon film 30 into a polycrystalline form. In this embodiment, a xenon chloride (XeCl) excimer laser (wavelength of 308 nm) is employed in the annealing/laser annealing process. In this annealing process, the substrate 20 is irradiated by the laser beam in an oxygen environment while maintaining the substrate 20 at room temperature (25° C.).

At the process stage where the above annealing is performed, the patterned silicon film islands 31 has been formed on the surface of the underlying protective film 21 which has been formed over the entire area of the glass substrate 20. Thus, in the present embodiment, laser irradiation is performed in such a manner that only the remaining portions of the silicon film islands 31 to be used to form TFTs 10 (regions A11 of the silicon film islands 31 remaining in the active matrix section 9 and regions A12 of the silicon film islands 31 remaining in the data driver sections 7) are irradiated by the laser beam, while the other portions B11 and B12 are not subjected to intentional irradiation of the laser beam.

In the present embodiment, the islands 31 of the silicon film used to form TFTs 10 are located in straight lines along the X direction in the active matrix section 9. In the data driver sections 7, on the other hand, to place a great number of TFTs 10 in a limited small area, the islands 31 of the silicon film are not aligned in simple straight lines along the X direction, as opposed to those in the active matrix section 9. Therefore, in the data driver sections 7, it is impossible to selectively irradiate only the islands 31 of silicon film by the laser beam and thus the entire portions of the areas A12 of the data driver sections 7 are irradiated by the laser beam.

In the present embodiment, as described above with reference to FIGS. 7(A), (B), and (C), the regions L4 irradiated by the laser beam extend along a longer length in the X direction than in the Y direction. The islands 31 of silicon film are irradiated by a line-shaped laser beam LO having an irradiation area L4 extending a greater length in the X direction and having an optical power profile with a half-width in the Y direction smaller than the pixel pitch in the Y direction.

Figure 13A:
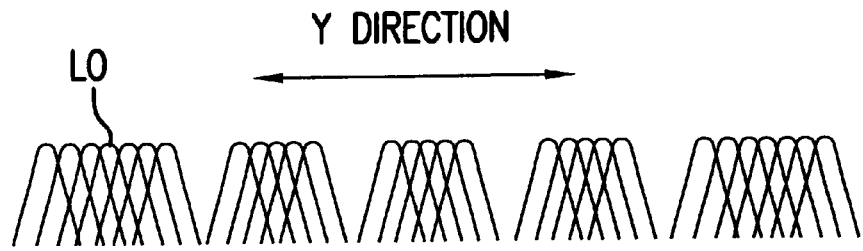
FIG. 13(A) is a schematic representation of selective irradiation of the laser beam in the annealing process according to the second embodiment of the invention, and (B) is a schematic representation of the moving speed of a substrate during the annealing process.
Figure 13B:
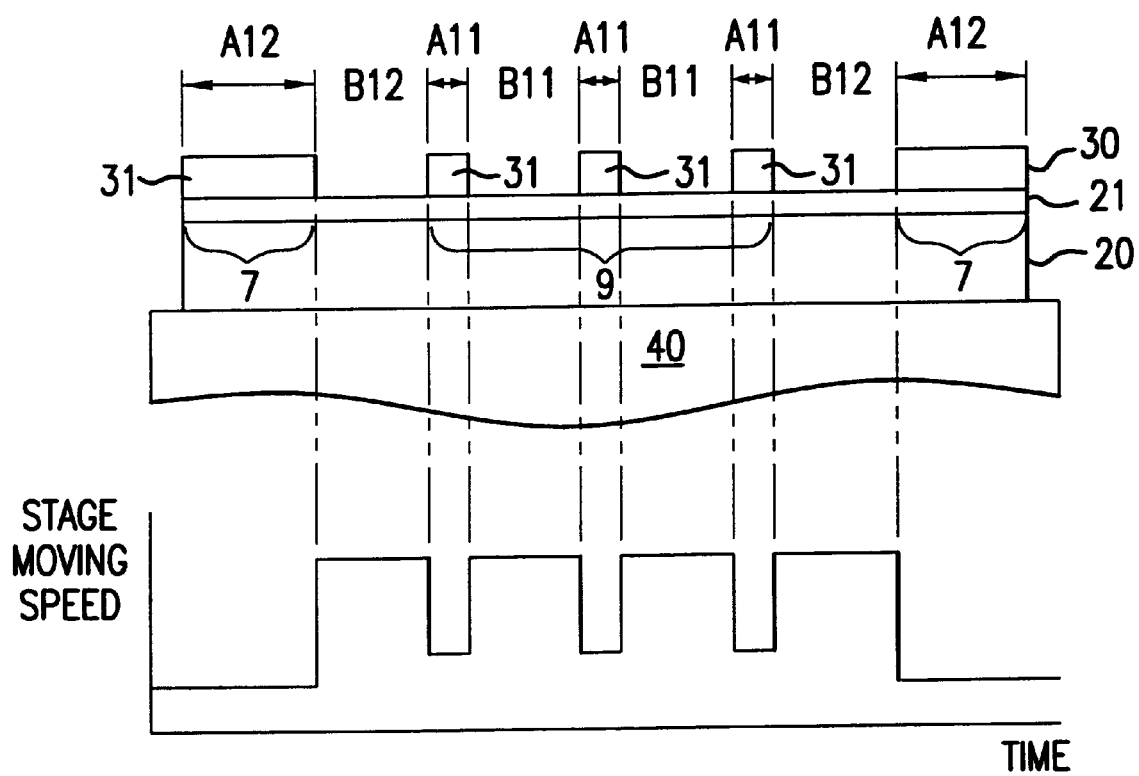

In the present embodiment, when the silicon film 30 is annealed using the line-shaped laser beam LO in the above-described form, the position of the line-shaped laser beam LO is fixed while the substrate 20 is carried by the stage 40 so that it moves in the Y direction as shown in FIG. 13(A) thereby continuously melting and crystallizing the islands 31 of silicon film. As shown in FIG. 13(B), the stage 40 is moved at a low speed when the regions A12, in which the data driver sections 7 are to be formed, are irradiated by the line-shaped laser beam LO. On the other hand, the stage 40 is moved at a high speed when the line-shaped laser beam LO strikes the regions B12 between either of the data driver sections 7 and a region in which TFTs 10 will be formed. When the regions A11 in which TFTs 10 will be formed are irradiated by the line-shaped laser beam LO, the stage 40 is moved at a low speed, while the stage 40 is moved at a high speed when the line-shaped laser beam strikes regions B11 between adjacent regions in which TFTs 10 will be formed. In this technique, only those islands 31 of amorphous silicon film which are required to be converted into polycrystalline form are subjected to the laser annealing process.

In the above annealing process, the line-shaped laser beam LO selectively and repeatedly strikes the regions A12 in which the data driver sections 7 are to be formed and the regions A11 in which the TFTs 10 of the active matrix section 9 are to be formed, and thus a high degree of crystallization is achieved in the islands 31 of silicon film in the regions A12 for the data driver sections 7 and the regions A11 for the TFTs 10 of the active matrix section 9. In particular, the TFTs 10 in the data driver sections 7 are required to operate at a high speed. To meet the above requirement, when the regions A12 for the data driver sections 7 are irradiated by the line-shaped laser beam LO, the stage 40 is moved at a speed as low as possible or the regions A12 for the data driver sections 7 are irradiated an increased number of times by the line-shaped laser beam LO.

Figure 11E:
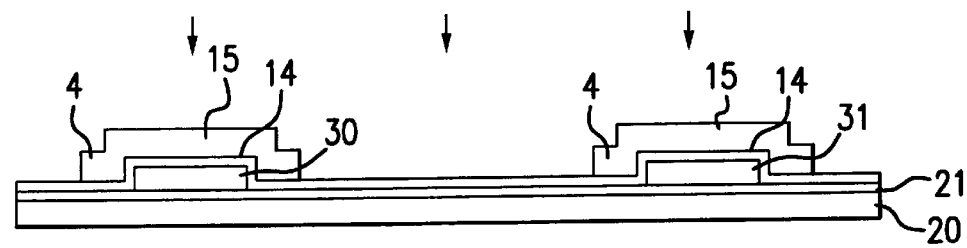

Then, as shown in FIG. 10(D) and FIG. 11(E), a silicon oxide film having a thickness of 1200 Å is formed at a temperature in a range from 250° C. to 300° C. by means of ECR-PECVD thereby forming the oxide gate insulating film 14 over the silicon film islands 31.

A thin tantalum film with a thickness of 6000 Å is then deposited on the surface of the oxide gate insulating film 14 by means of sputtering. The thin tantalum film is then patterned using a photolithography technique so as to form the gate electrodes 15. In the present embodiment, the process of forming the thin tantalum film is performed using argon gas including 6.7% nitrogen as a sputtering gas while maintaining the substrate at 180° C. The thin tantalum film formed in the above-described manner will have an a crystal structure and a resistivity of 40 mΩcm.

With a bucket-type non-mass-separation ion implanting apparatus (ion doping apparatus), impurity ions are then implanted into the silicon film islands 31 using the gate electrode 15 as a mask so that source regions 11 and drain regions 12 are formed at self-aligned positions relative to the gate electrodes 15. The regions of the silicon film islands 31 where no impurity ions are implanted become channel regions 13. In the present embodiment, the ion implantation process is performed using 5% phosphine ($PH_3$) diluted with hydrogen as the source gas with an acceleration voltage of 100 KeV so that the total dose becomes $1 \times 10^{16}$ ions $cm^{-2}$.

In the case where p-channel TFTs are formed, 5% diborane ($B_2H_6$) diluted with hydrogen gas may be used as the source gas.

Figure 11F:
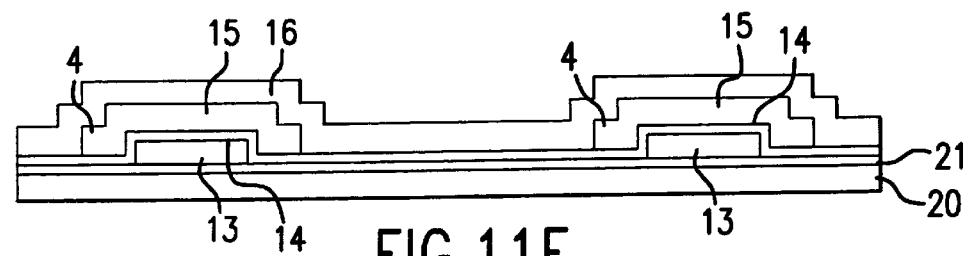
Figure 12:
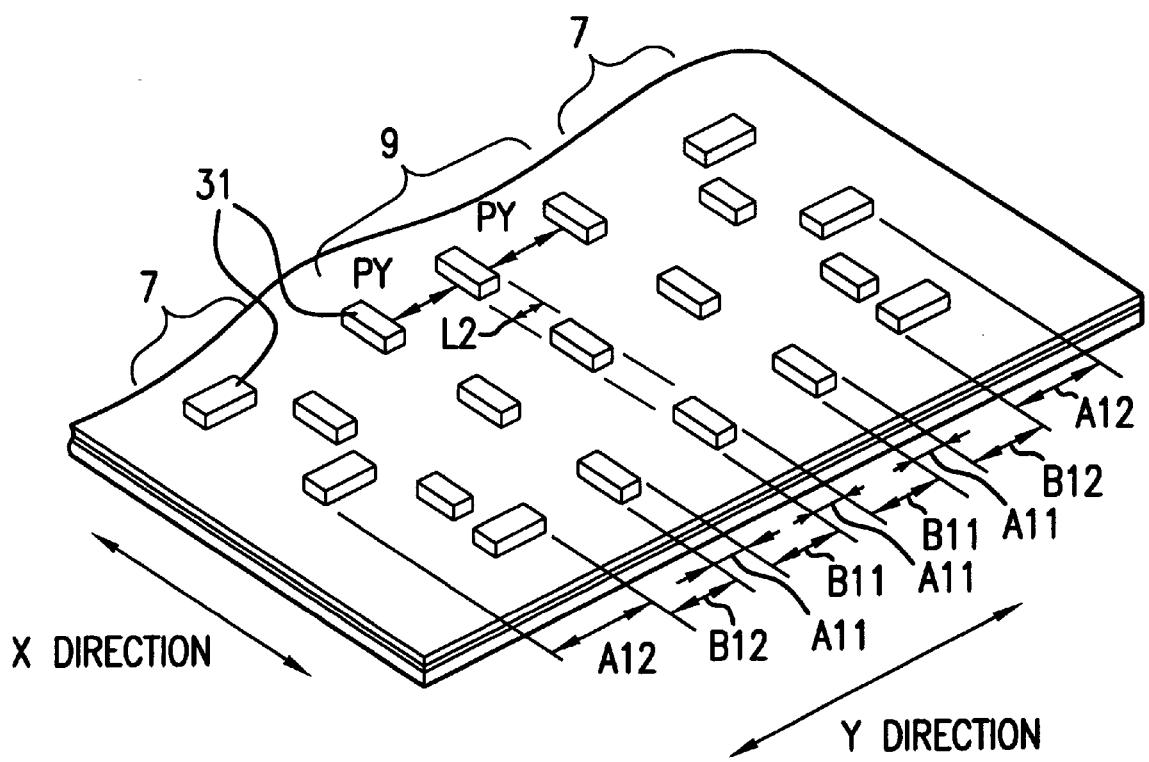
FIG. 12 is a schematic diagram illustrating an annealing process by means of irradiation of a laser beam according to the second embodiment of the invention.

Then, as shown in FIG. 10(E) and FIG. 11(F), a silicon oxide film serving as the interlayer insulating film 16 with a thickness of 5000 Å is deposited by means of PECVD at a temperature in a range from 250° C. to 300° C. In this process, TEOS (Si—(O—$CH_2$—$CH_3$)$_4$) and oxygen are used as source gases. The film deposition is performed while maintaining the substrate at 300° C.

Heat treatment is then performed in an oxygen environment at 300° C. for 1 hour so as to activate the implanted phosphorus ions and also to improve the quality of the interlayer insulating film 16.

The contact holes 17 and 18 are then formed in the interlayer insulating film 16. After that, via these contact holes 17 and 18, source electrodes (data lines 3) are electrically connected to the corresponding source regions 11 and drain electrodes (pixel electrodes 19) are electrically connected to the corresponding drain regions 12 thereby forming TFTs 10.

In the method of producing an active matrix substrate according to the present embodiment, as described above, the laser annealing process is performed in such a manner that the areas A11, in which pixel TFTs 10 will be formed along the X direction, are irradiated by the line-shaped laser beam LO having an irradiation area extending a greater length in the X direction and having an optical power profile with a half-width in the Y direction smaller than the pixel pitch in the Y direction. This method allows only the remaining portions of silicon film islands 31 to be intensively irradiated by the laser beam so that these portions are exposed to a high level of laser power. Furthermore, in this method, the line-shaped laser beam LO is aligned relative to the patterned silicon film islands 31, and thus the irradiation can be performed with improved throughput.

Furthermore, in the present embodiment, as shown in FIGS. 13(A) and (B), during the operation of continuously melting and crystallizing the silicon film islands 31 by moving the substrate 20 relative to the line-shaped laser beam LO in the Y direction, the stage 40 is moved at a low speed when the line-shaped laser beam LO strikes the regions A11 and A12 in which TFTs 10 or the data driver sections 7 are to be formed, while the stage 40 is moved at a high speed when the line-shaped laser beam LO strikes the other regions. This allows a reduction in time spent to irradiate unwanted regions and thus total laser annealing time is reduced. As a result, throughput is improved.

Although, in the active matrix section 9, the TFTs 10 are located in straight lines in the X direction, the TFTs 10 in the data driver sections 7 are not located in straight lines. Nevertheless, in the present embodiment, the entire portions of the regions for the data driver sections 7 are subjected to the laser annealing process so that the TFTs 10 in the data driver sections 7 are produced of the silicon film islands 31 annealed into the polycrystalline form and thus the TFTs 10 in the data driver sections 7 also have a high carrier mobility.

The channel region 13 of each TFT 10 is constructed such that the channel length extends in the X direction which is the same as the direction of the longer length of the line-shaped laser beam. This prevents insufficient annealing from occurring in some portion of the channel region 13 between the source region 11 and the drain region 12. As a result, it is possible to achieve high stability in the electrical characteristics of the TFTs 10.

In the first embodiment described above, although the laser annealing for the silicon film 30 formed on the surface of the substrate 20 is performed in a selective fashion in the Y direction, the silicon film 30 is irradiated in a continuous fashion in the X direction and thus those parts which will be removed in the later patterning process are also irradiated by the line-shaped laser beam. In this third embodiment, unlike the first embodiment, those parts which are not needed to be irradiated by the line-shaped laser beam are not subjected to irradiation along the X direction. The other processes except for the annealing process are performed in the same manner as in the first embodiment, and thus only the annealing process will be described below.

Figure 14:
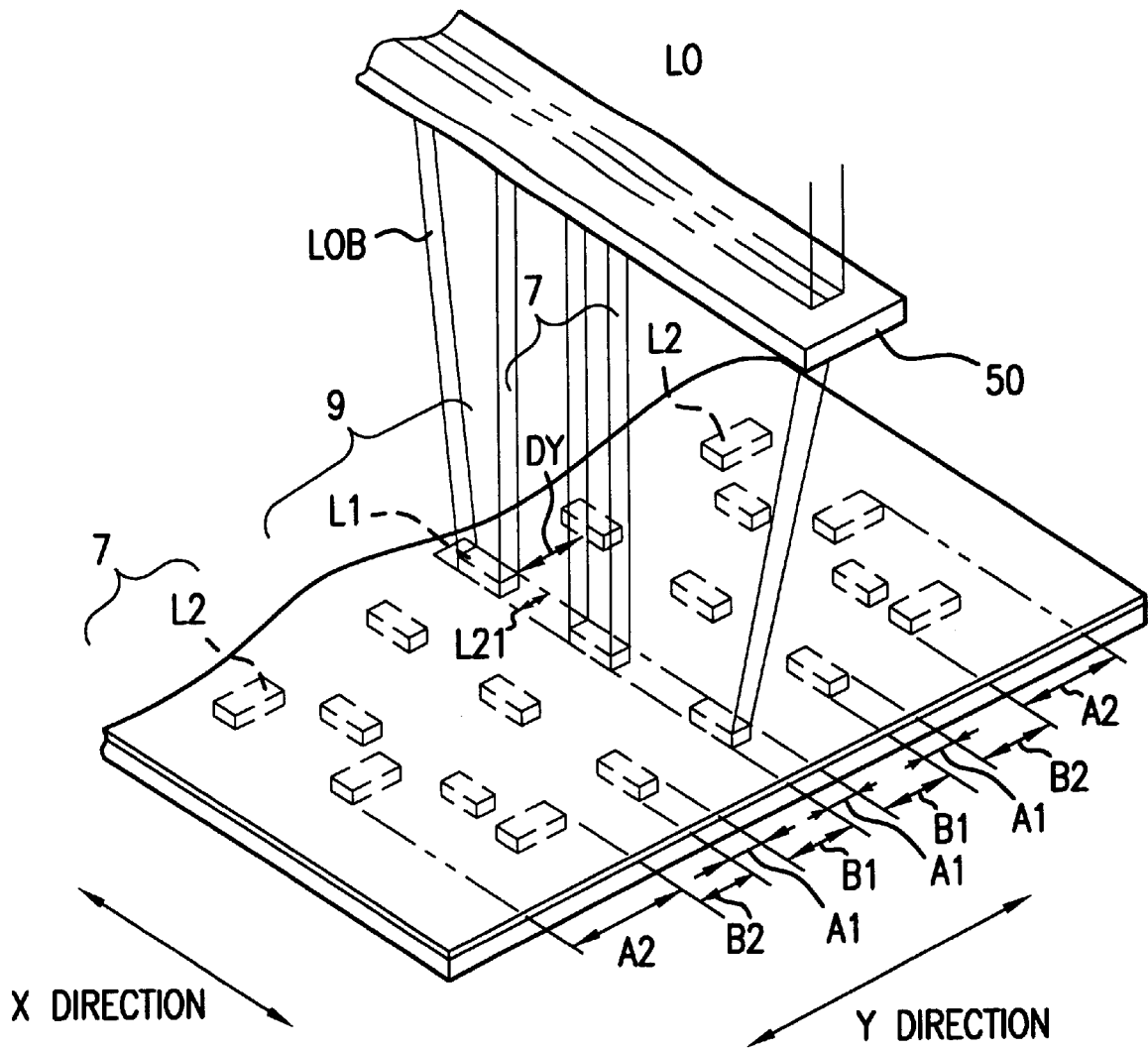
FIG. 14 is a schematic representation of selective irradiation of a laser beam in an annealing process according to a third embodiment of the invention.

In the present embodiment, as shown in FIG. 14, an optical system 50 is disposed in the middle of an optical path of the laser beam so that the line-shaped laser beam LO is converted into a spot-shaped beam LOB by which only those regions of the active matrix section 9 in which TFTs 10 will be formed are selectively irradiated in terms of the X direction across the substrate 20. Specific examples of the optical system 50 include a diffraction grating and a micro lens. The irradiation area of the spot-shaped beam LOB is selected in accordance with the geometric pitch of TFTs 10 in the X direction in the active matrix section 9.

In the laser annealing process with such the spot-shaped beam LOB, the silicon film 30 in the active matrix section 9 is irradiated by the laser beam in such a manner that only particular regions A1 along the Y direction in which TFTs will be formed are selectively irradiated by the laser beam without exposing the regions B2 between the regions A1 for TFTs 10 to intentional irradiation of the laser beam. Thus, unnecessary irradiation along the Y direction does not occur. Also in the X direction, only particular areas (represented by broken lines L1) in which TFTs 10 will be formed are irradiated by the laser beam without exposing unwanted regions to the laser irradiation. Thus, the laser beam is concentrated onto those regions which actually need to be annealed and therefore those regions are exposed to high intensity of laser irradiation. As a result, the silicon film 30 is melted and crystallized in a short time, and thus throughput is improved.

As described above, although the TFTs 10 in the active matrix section 9 are aligned in straight lines in both X and Y directions, the TFTs 10 in the data driver sections 7 are not aligned in straight lines. Therefore, when the regions for the data driver sections 7 are subjected to the laser annealing process, the optical system 50 is removed so that the laser annealing is performed over the entire regions for the data driver sections 7.

Although in the present embodiment the silicon film 30 is irradiated by the spot-shaped laser beam before patterning the silicon film 30, the irradiation of the spot-shaped laser beam may also be performed on the silicon film islands 31 after being patterned as in the second embodiment.

Figure 15:
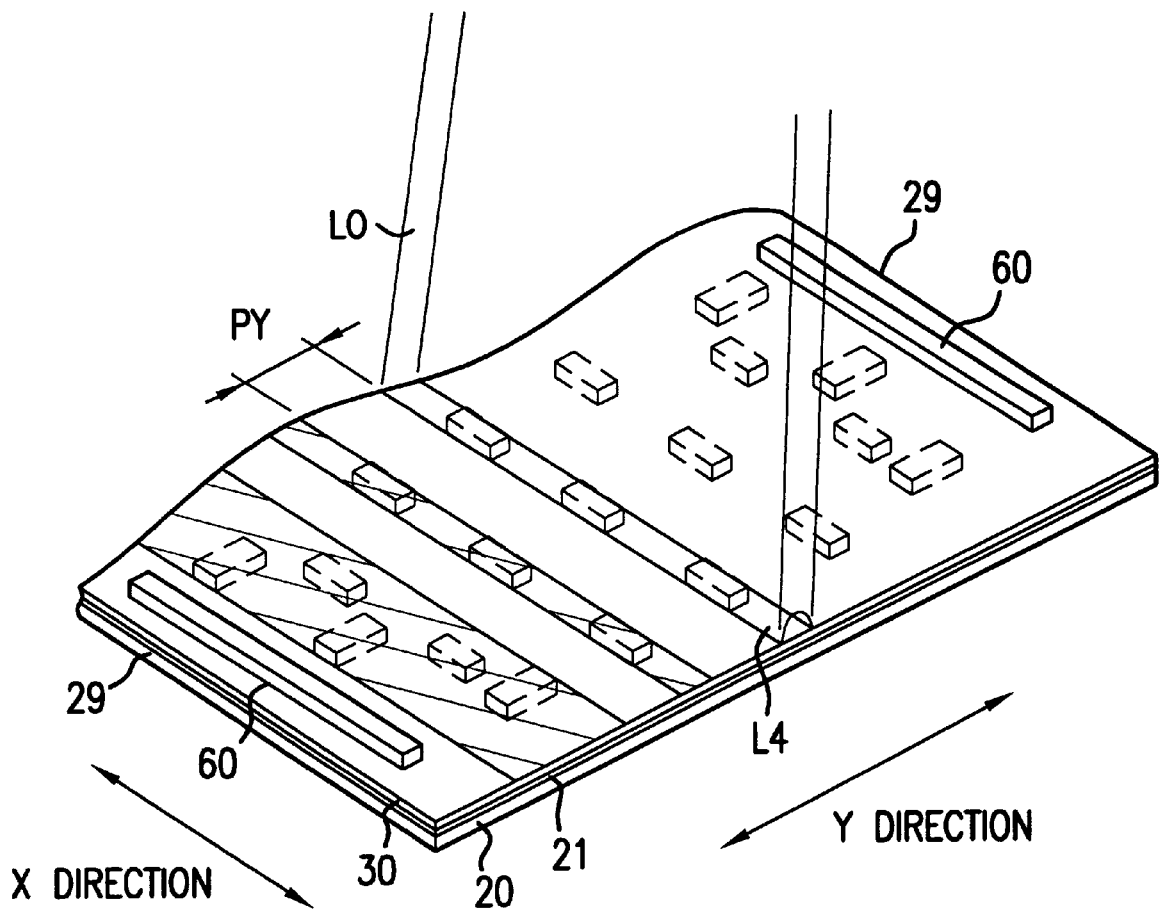
FIG. 15 is a schematic diagram illustrating the process of forming an alignment pattern by means of irradiation of a laser beam in an annealing process according to a fourth embodiment of the invention.

In the first through third embodiments, as described above, the silicon film 30 formed on the surface of the substrate 20, or the patterned silicon film islands 31 are irradiated by the laser beam. In this fourth embodiment, as shown in FIG. 15, the above laser beam irradiation process is also used to cure a photo-setting resin 60 which is coated on the underlying protective film 21 on the surface of the glass substrate 20 in a particular area extending along for example an edge 29 facing in the X direction of the glass substrate 20. The layer of the cured resin 60 is used, in following processing steps, as an alignment pattern to correctly position a mask. If such an alignment mark is formed, a conventional alignment technique can be employed in a patterning process following the laser annealing process.

Figure 16:
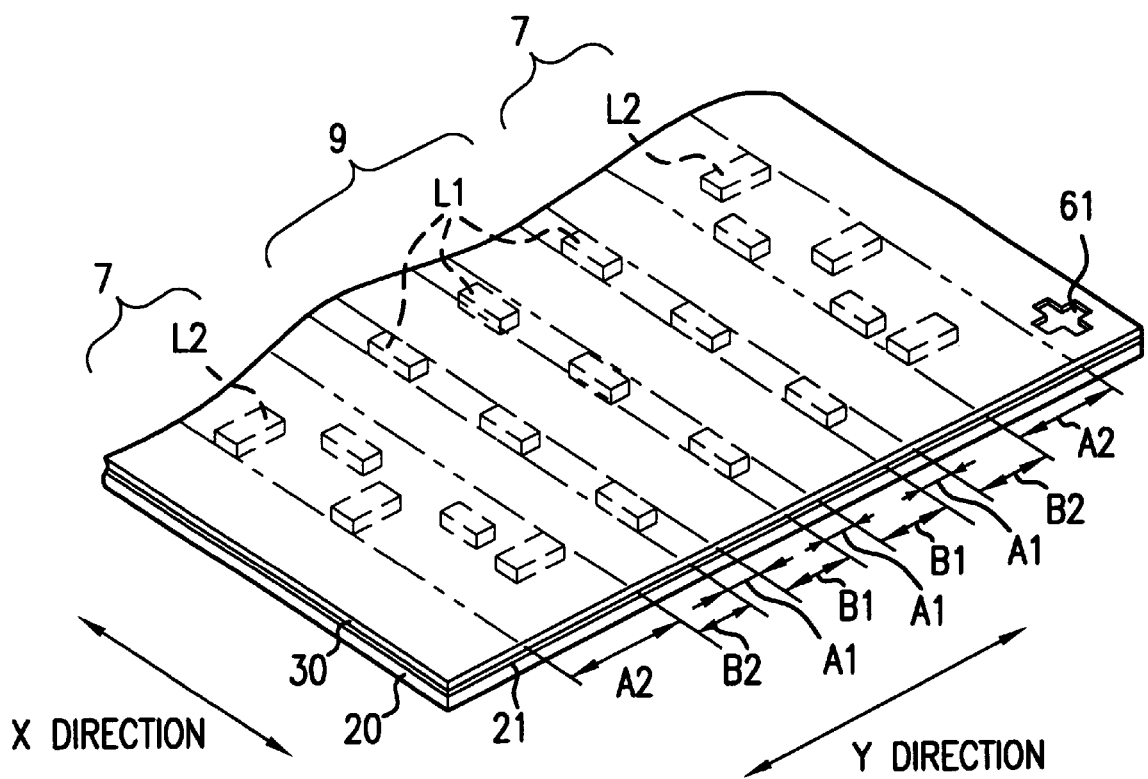
FIG. 16 is a schematic diagram illustrating an alignment mark formed in an underlying protective film according to a fifth embodiment of the invention.

In the first through third embodiments, the alignment may also be performed using either an alignment mark formed in the silicon film 30 on the surface of the substrate 20 or an alignment mark 61 formed in the underlying protective film 21 on the surface of the glass substrate 20 as shown in FIG. 16.

In the first through fifth embodiment, the annealing process is performed by means of laser annealing process. However, the annealing process may also be performed by means of a combination of laser annealing and rapid thermal annealing (RTA). In this case, the rapid thermal annealing may be performed in another separate apparatus before and/or after the laser annealing process. Or, as shown in FIGS. 17(A)–(C), both the laser annealing process and the rapid thermal annealing process may be performed at the same time using a laser annealing apparatus having an additional optical apparatus including an arc lamp 91 and a reflector 92 for the purpose of the rapid thermal annealing.

Figure 17A:
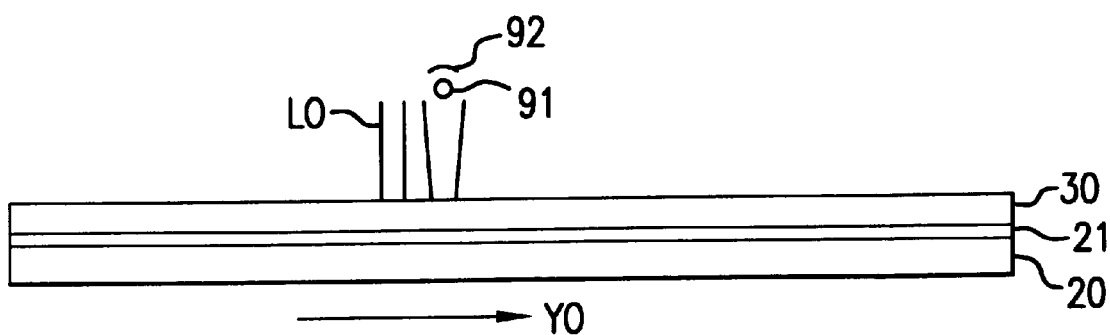
FIGS. 17(A)–(C) are schematic diagrams illustrating the relative location between an area irradiated by a laser beam and an area irradiated by an arc lamp for a rapid thermal annealing process.

In a specific example shown in FIG. 17(A), among the above annealing methods, the arc lamp 91 for the purpose of the rapid thermal annealing is disposed so that an area slightly behind of the irradiation area of the line-shaped laser beam LO in the moving path of the glass substrate 20 is illuminated by the arc lamp 91. With this arrangement, the silicon film 30 is subjected to rapid thermal annealing after laser annealing process. Thus, even if there are some silicon atoms located at positions slightly shifted from correct lattice points after the laser annealing process, these slight shifts are corrected during the following rapid thermal annealing process. That is, the stress induced during the crystallization process of the silicon film 30 is relaxed and therefore the crystallinity is improved. Furthermore, small amorphous portions located between crystal grains are crystallized and thus the degree of crystallization of the silicon film 30 is improved. Furthermore, micro-crystals are recrystallized into greater-sized crystals and thus there will be a less number of crystal grains. Therefore, although the growth of the crystalline silicon film 30 on the substrate 20 is not based on the epitaxial technique, it is possible to achieve high quality in the silicon film 30. Furthermore, since the rapid thermal annealing is a simple process in which the substrate 20 is heated for a short time on the order of a few seconds, the rapid thermal annealing can be performed in a shorter time than the laser annealing process. Therefore, when the rapid thermal annealing process is combined with the laser annealing process, it is not required to decrease the operation speed of the laser annealing process.

Figure 17B:
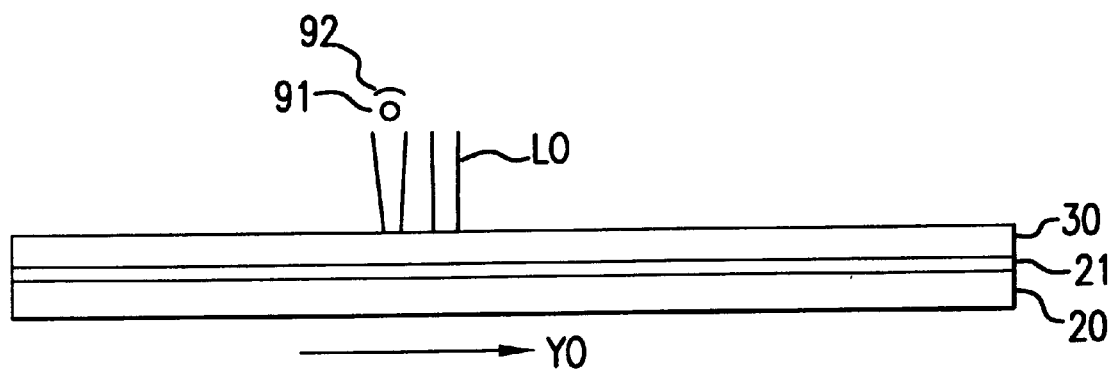

On the other hand, in the method shown in FIG. 17(B), the arc lamp 91 for the purpose of the rapid thermal annealing is disposed so that the region irradiated by the arc lamp 91 is located slightly ahead of the irradiation region of the line-shaped laser beam LO on the way of passage of the glass substrate 20 in the direction denoted by an arrow YO. In this arrangement, the silicon film 30 is first subjected to the rapid thermal annealing and subsequently to the laser annealing. As a result, the silicon film 30 is melted and crystallized in the rapid thermal annealing process, and further annealed by the laser beam while being heated uniformly without having to use an additional large-scale pre-heating apparatus.

Figure 17C:
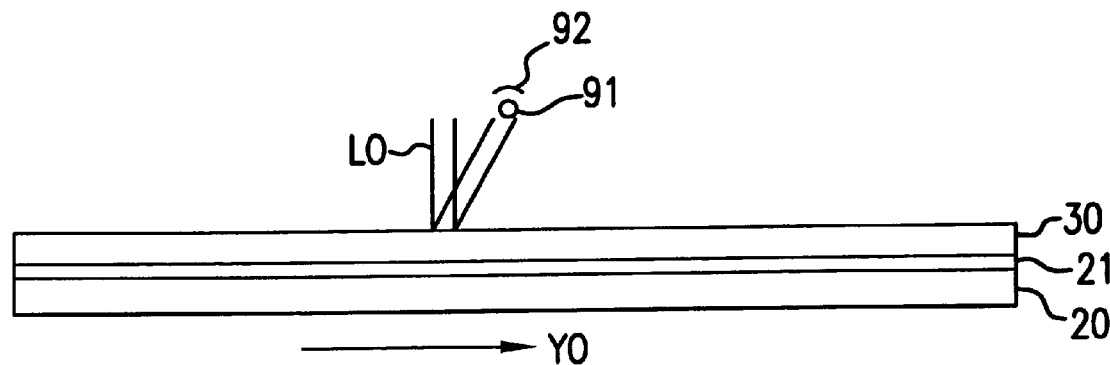

In the case of the method shown in FIG. 17(C), the arc lamp 91 for the rapid thermal annealing is disposed so that the region irradiated by the line-shaped laser beam LO is also irradiated by the arc lamp 91 in an overlapped fashion. In this arrangement, the silicon film 30 is simultaneously subjected to both the rapid thermal annealing and laser annealing. Therefore, the silicon film 30 is not only melted and crystallized by the rapid thermal annealing but also annealed by the laser beam while being heated uniformly.

In any of the embodiments described above, if the laser annealing for the scanning line driver circuit is performed after rotating the substrate by 90° from the position at which laser annealing is performed for the data lines and pixel thin-film transistors, then it is possible to improve the carrier mobility of TFTs in the driver circuit while maintaining enhanced throughput.

As described above, the active matrix substrate for use in a liquid crystal display device according to the present invention is characterized in that in the laser annealing process for melting and crystallizing the semiconductor film, the semiconductor film is irradiated with the line-shaped laser beam having an irradiation area extending a longer length in the X direction than in the Y direction and having an optical power profile in the Y direction smaller than the pixel pitch in the Y direction, wherein the X direction is defined as the direction in which the pixel thin-film transistors are aligned in substantially straight lines and the Y direction is defined as a direction crossing the X direction. In this method of the invention, the laser beam is concentrated onto those regions which actually need to be annealed and therefore those regions are exposed to a high intensity of laser irradiation. As a result, the semiconductor film is melted and crystallized in a short time, and thus throughput is improved.

In the above laser annealing process according to the present invention, the semiconductor film is preferably melted and crystallized continuously by moving the substrate in the Y direction relative to the line-shaped laser beam so that particular regions along the Y direction where the pixel thin-film transistors are to be formed are selectively irradiated by the line-shaped laser beam. This allows a reduction in time spent to irradiate unwanted regions and thus total laser annealing time is reduced. As a result, high throughput can be obtained.

In a preferable mode of the present invention, the above-described laser annealing process is performed before a patterning process so that an underlying protective film is prevented from being damaged by direct irradiation of the laser beam. In this case, the alignment between an annealing pattern produced in the laser annealing process and a mask pattern used in the patterning process is preferably performed by using the color of the silicon film subjected to the laser annealing process which varies depending on the degree of irradiation of the line-shaped laser beam. With this technique, the patterning is performed in accordance with the actual annealing pattern and thus it is possible to suppress the variations in characteristics of TFTs. Furthermore, this technique makes it possible to further improve throughput by crystallizing only channel regions.

It is also preferable that a predetermined area of the substrate be coated with a photo-setting resin, and the photo-setting resin be also irradiated by the laser beam in the laser annealing process thereby curing the photo-setting resin and automatically forming an alignment pattern used, in a subsequent process, to align a mask relative to the substrate. If such an alignment mark is formed, a conventional alignment technique can be employed in a patterning process following the laser annealing process.

Furthermore, if the pixel thin-film transistors are formed in such a manner that the channel length of each pixel thin-film transistor extends in the X direction, it is possible to prevent insufficient annealing from occurring in some portions along the channel length. As a result, it is possible to achieve high stability in the electrical characteristics of the TFTs.

In the case where an active matrix section and a driver circuit are formed on the same substrate, if the whole area of the driver circuit is annealed, the whole semiconductor film forming TFTs is entirely crystallized even though the TFTs in the driver circuit are not aligned.

Furthermore, if an optical system is disposed in the middle of the optical path of the laser beam so that the line-shaped laser beam is converted via the optical system into a spot-shaped laser beam thereby selectively irradiating particular areas along the X direction in which the pixel thin-film transistors are to be formed, no irradiation of the laser beam occurs for those portions along the X direction which are not required to be irradiated and thus it is possible to have a corresponding increase in the intensity of the laser beam falling onto the areas which actually require irradiation.

In the annealing process, if the rapid thermal annealing process is combined with the laser annealing process, it is possible not only to take advantages of the respective processes, but the combination of the processes also provides additional advantages of pre-heating and enhancement of crystallization.

Figure 18:
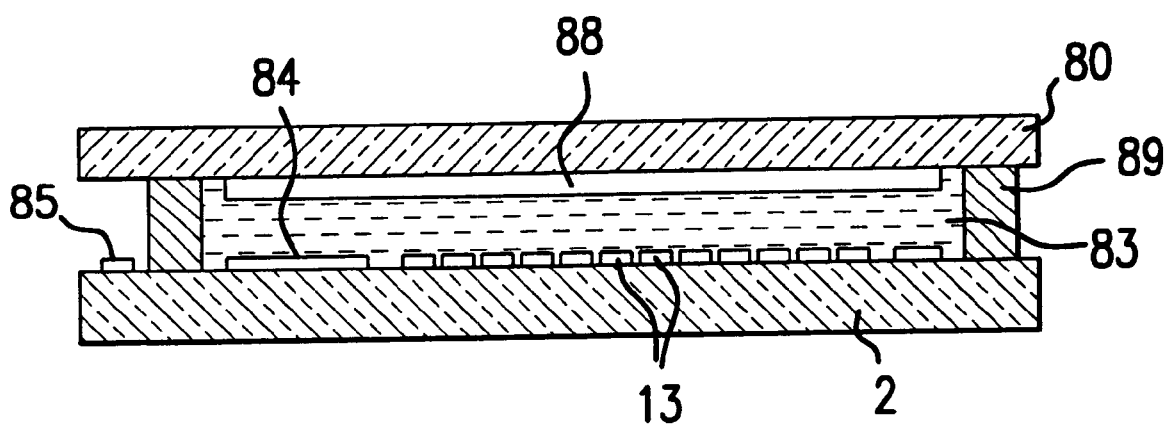
FIG. 18 is a cross-sectional view of a liquid crystal display device using the active matrix substrate.

FIG. 18 illustrates the cross-sectional structure of a liquid crystal display device using an active matrix substrate according any of the embodiments described above. As shown in FIG. 18, the liquid crystal display device includes an incidence-side glass substrate 80 disposed at a proper distance apart from the active matrix substrate 2, wherein a transparent conductive film (ITO) serving as an opposite electrode 88, to which an opposite electrode voltage is applied, is disposed on the surface of the glass substrate 80. The periphery of the space between the glass substrate 80 and the active matrix substrate 2 is sealed by a sealing material 89, and the space is filled with a TN (twisted nematic) liquid crystal 83 or the like. The position of the sealing material 89 is designed so that a pad area 85 is located outside the sealing material 89. A peripheral circuit 84 is prevented from illuminating light by a black matrix or the like provided on the opposite substrate, at a location above the peripheral circuit 84.

Figure 19:
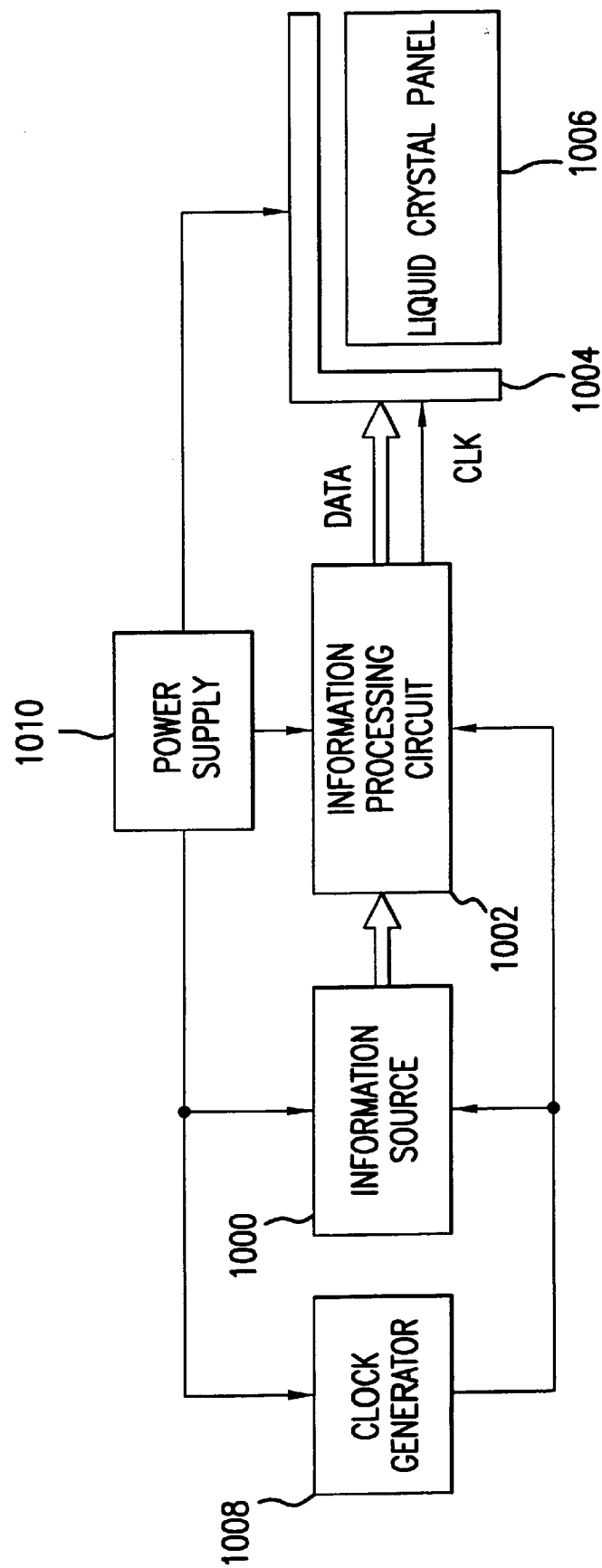
FIG. 19 is a block diagram representing electronic equipment incorporating the liquid crystal display device in FIG. 18.

Electronic equipment may be realized using the liquid crystal display device described above. As shown in FIG. 19, the electronic equipment may include an information source 1000 for generating information to be displayed, an information processing circuit 1002, a display driving circuit 1004, a display panel 1006 such as a liquid crystal panel, a clock generator 1008, and a power supply 1010. The information source 1000 for generating information to be displayed includes memory such as ROM and RAM, and a tuner circuit for selecting a desired television signal and outputting the selected signal. In response to the clock signal generated by the clock generator 1008, the information source 1000 outputs information such as a video signal to be displayed. The processing circuit 1002 processes the information to be displayed in response to the clock signal generated by the clock generator 1008, and outputs the resultant signal. The processing circuit 1002 includes for example an amplifier, an inverter, a phase developing circuit, a rotating circuit, a gamma correction circuit, and a clamping circuit. The driver circuit 1004 for driving the liquid crystal panel 1006 includes a scanning driver circuit and a data driver circuit. The power supply 1010 supplies electric power to the respective circuit elements described above. Specific examples of electronic equipment include a liquid crystal projector such as that shown in FIG. 20, a personal computer (PC) capable of handling multimedia data or engineering work station (EWS) such as that shown in FIG. 21, a pager such as that shown in FIG. 22, a portable telephone, a word processor, a television receiver, a video tape recorder with a view-finder or a monitor display, a pocket-sized electronic notebook, a calculator, a car navigation system, a POS terminal, and other devices with a touch panel.

Figure 20:
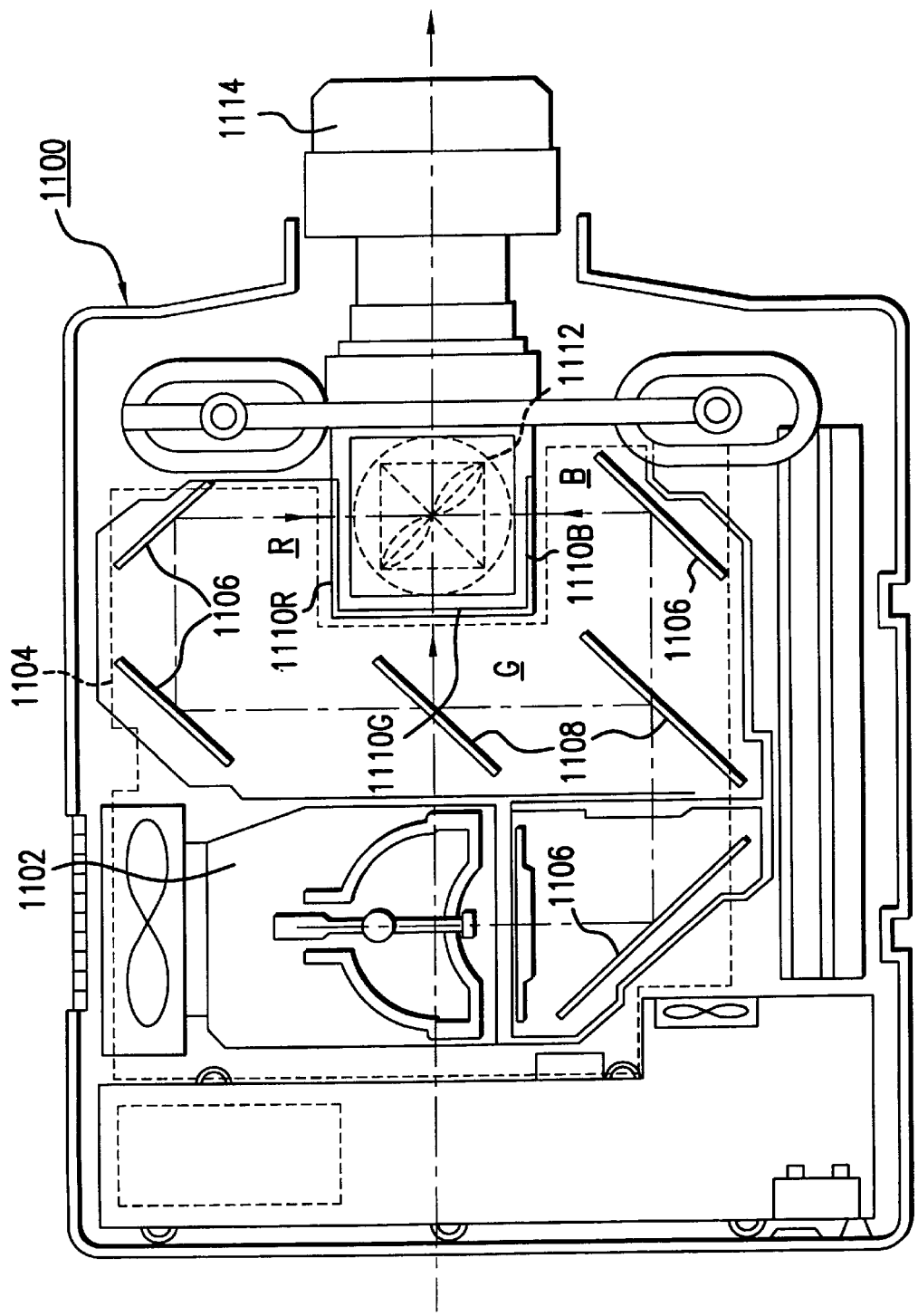
FIG. 20 is an internal side view of a liquid crystal projector.

FIG. 20 illustrates an example of a liquid crystal projector using a transmission type liquid crystal as a light valve. An optical system includes for example a 3-plate prism is employed in the projector. In the projector 1100 shown in FIG. 21, a light ray is emitted from the lamp unit 1102 of a white light source, and separated into three color components of R, G, and B via a plurality of mirrors 1106 and two dichroic mirrors 1108 disposed in a light guide 1104. The separated light rays are directed to three liquid crystal panels 1110R, 1110G, and 1110B for displaying images of respective colors. The light rays are modulated by the respective liquid crystal panels 1110R, 1110G, and 1110B, and fall onto a dichroic prism 1112 from three directions. At the dichroic prism 1112, the red R and blue B light rays are bent by 90° while the green G light ray passes through the dichroic prism 1112 without being bent. As a result, the three color light rays are combined into a single ray and thus a color image is formed on a screen via a projection lens 1114.

Figure 21:
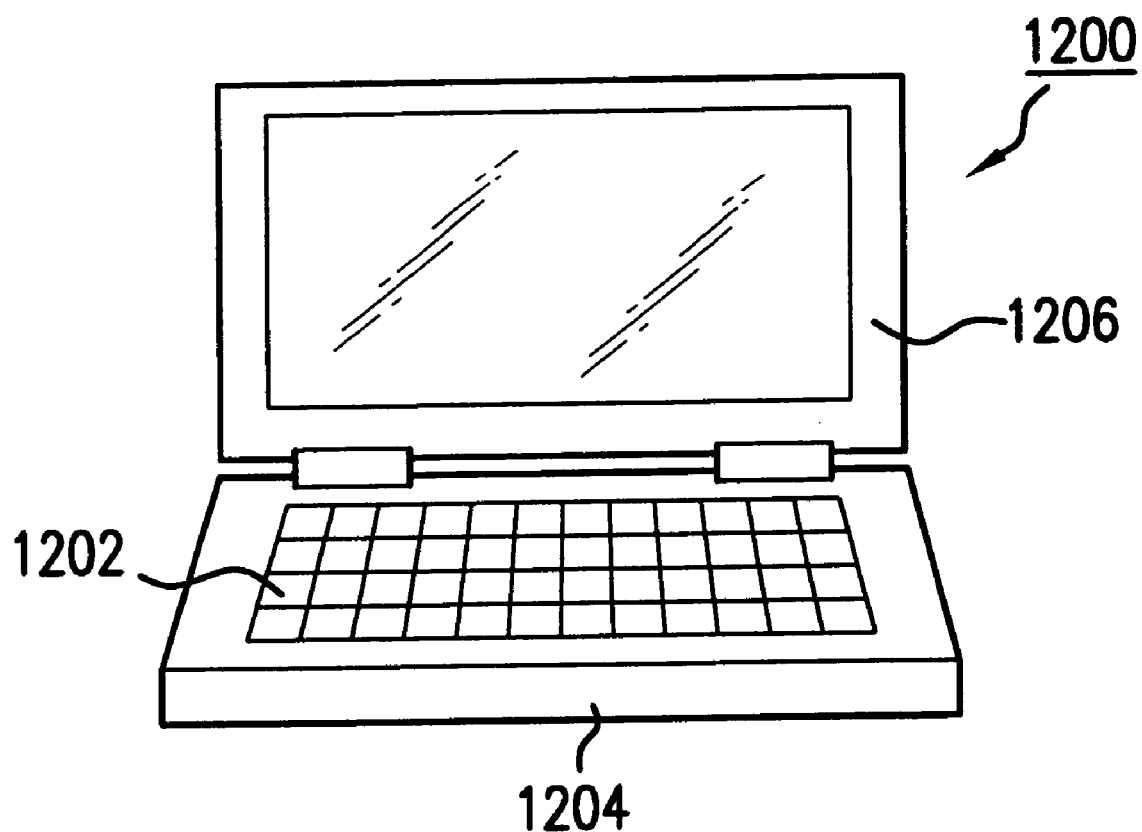
FIG. 21 is a front perspective view of a personal computer.

The personal computer 1200 shown in FIG. 21 includes a main part 1204 including a key board 1202 and a liquid crystal display 1206.

Figure 22:
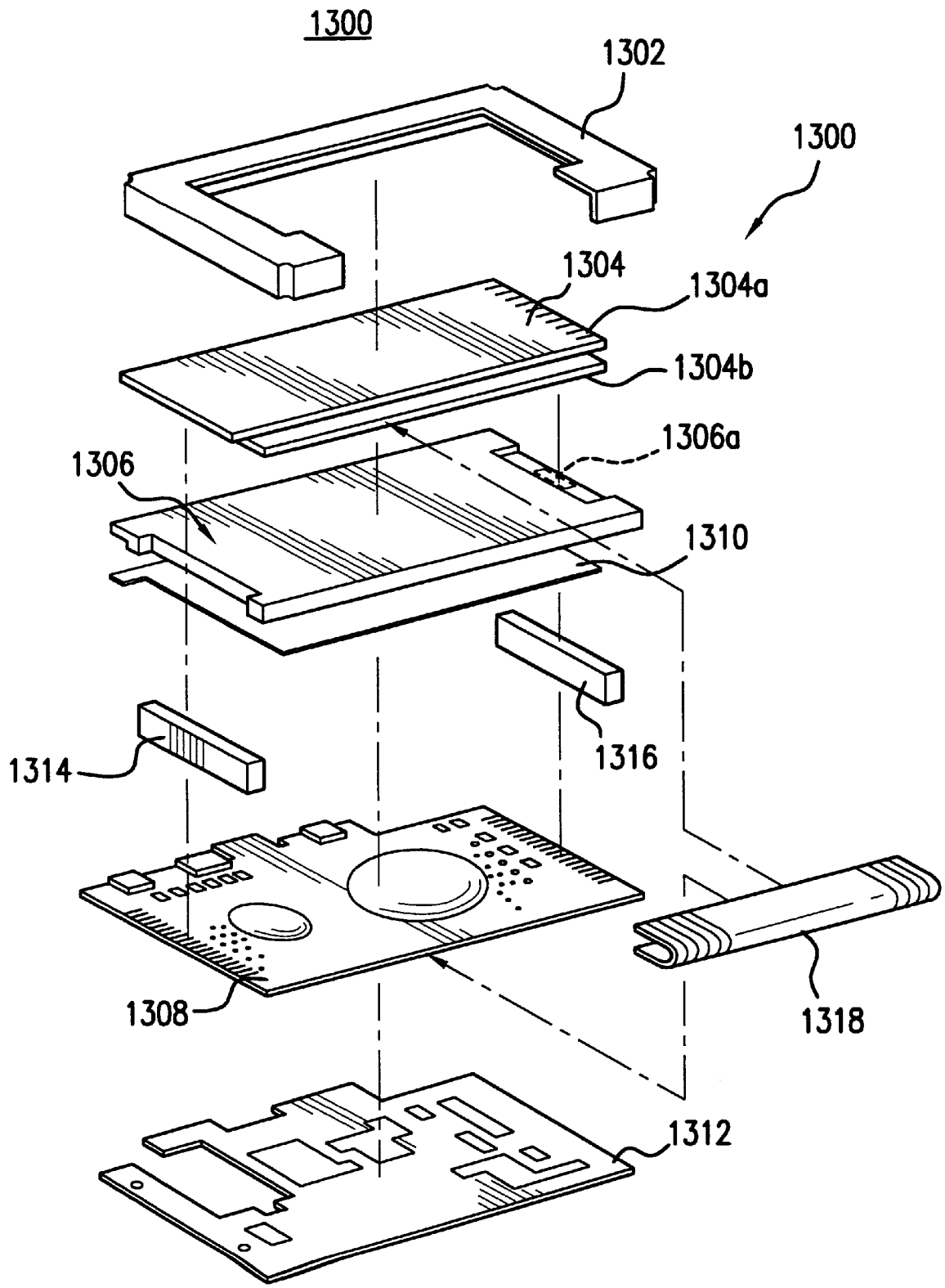
FIG. 22 is an exploded perspective view of a pager.

The pager 1300 shown in FIG. 22 includes a metal frame 1302 and other elements located inside the metal frame 1302, including a liquid crystal display panel 1304, a light guide 1306 with a back light 1306a, a circuit board 1308, first and second shield plates 1310 and 1312, two elastic conductors 1314 and 1316, and a film carrier tape 1318. The two elastic conductors 1314 and 1316 and the film carrier tape 1318 are used to connect the liquid crystal display panel 1304 to the circuit board 1308.

The liquid crystal display panel 1304 includes two transparent plates 1304a and 1304b and a liquid crystal sealed between these transparent plates thereby forming at least a dot matrix type liquid crystal display panel. On one of the transparent plates, there may be the display circuit 1004 and also an information processing circuit 1002, such as those shown in FIG. 19. Other circuits which cannot be mounted on the liquid crystal display panel 1304 may be disposed externally for example on the circuit board 1308 as shown in FIG. 22.

Figure 23:
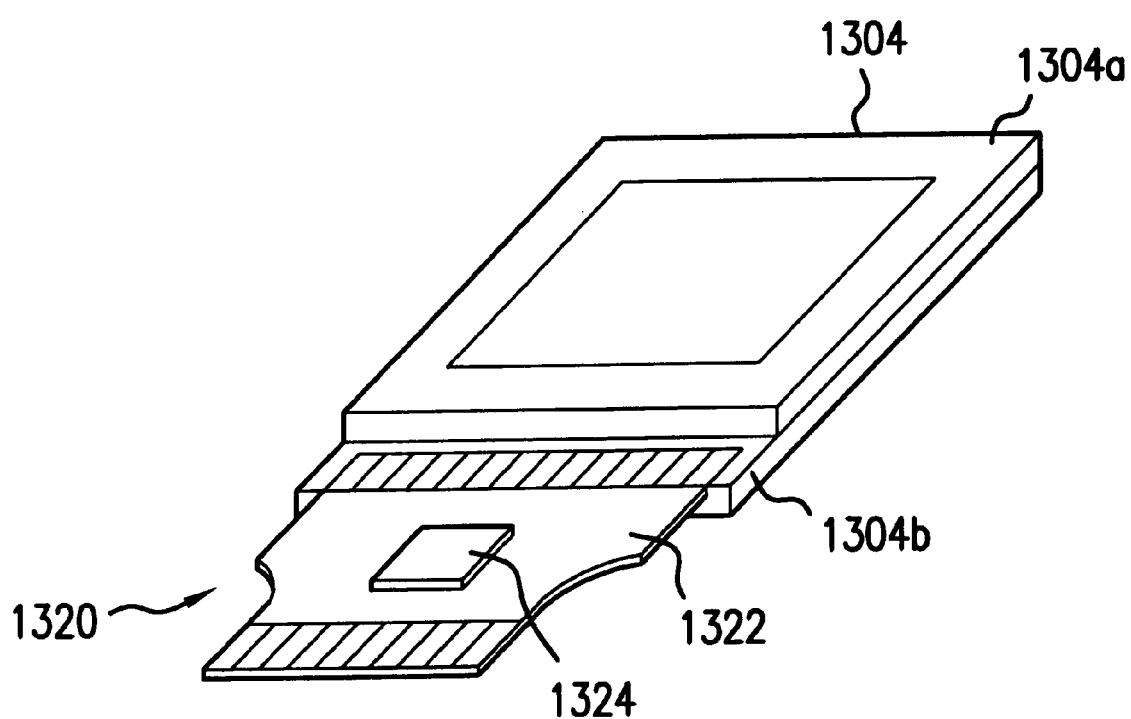
FIG. 23 is a perspective view of an electronic component functioning as a liquid crystal display device.

In the case of a pager such as that shown in FIG. 22, a circuit board 1308 is needed in addition to a liquid crystal display panel 1304. However, in general applications in which a liquid crystal display panel is used as an electronic component, a liquid crystal panel having the above structure 1304 can be used as a component. A liquid crystal display panel 1304 may be disposed in the metal frame 1302 serving as a case, and the resultant structure may be used as an electronic component functioning as a liquid crystal display device. Furthermore, in the case of the back light type, a liquid crystal display device may be constructed by disposing a liquid crystal display panel 1304 and a light guide including a back light 1306a in the metal frame 1302. FIG. 23 illustrates another example of an electronic component functioning as a liquid crystal display device. In this case, a liquid crystal display panel 1304 is formed with two transparent substrates 1304a and 1304b, and a TCP (tape carrier package) 1320 is connected to one of the transparent substrates. The TCP 1320 includes a polyimide tape 1322 on which a metal interconnection conducting film is formed, and an IC chip 1324 mounted thereon.

Although the present invention is described above with reference to preferred embodiments, the invention is not limited to those embodiments. Various modifications may be made without departing from the spirit and scope of the invention. For example, the invention may also be applied to an electroluminescent display device, plasma display device, or the like in addition to the liquid crystal display panel described above.

The method of producing a crystalline semiconductor film according to the present invention, and also the method of producing a thin-film semiconductor device such as a thin-film transistor and a solar cell based on the above method of producing a crystalline semiconductor film can be employed to produce a high-performance thin-film semiconductor device using a low-temperature process which makes it possible to use a low-cost glass substrate. If the present invention is employed to produce an active matrix liquid crystal display device, it is possible to stably produce a high-quality and large-sized liquid crystal display device at a low cost. If the invention is employed to produce a solar cell, it is possible to produce a solar cell with a high conversion efficiency. Furthermore, the invention can also be employed to easily and stably produce a high-performance electronic circuit.

According to the present invention, it is possible to produce a high-performance thin-film transistor at a low cost, which is very suitable to form an active matrix substrate for use in an active matrix liquid crystal display device. The invention is particularly useful to produce an active matrix substrate including a built-in high-performance driver circuit.

The liquid crystal display device according to the present invention has high performance and is inexpensive, and therefore it can be advantageously used as a display in a wide variety of devices such as a notebook-type full-color personal computer.

Electronic equipment according to the present invention has high performance and is inexpensive, and therefore it can be advantageously used in a wide variety of applications.

What is claimed is:

1. A method of producing an active matrix substrate, said active matrix substrate including: a plurality of scanning lines formed on a base substrate and a plurality of data lines crossing said plurality of scanning lines; a plurality of pixel regions divided by said data lines and said scanning lines; and pixel electrodes and pixel thin-film transistors formed in respective said pixel regions, said method comprising the steps of:
   forming a semiconductor film used to form said pixel thin-film transistors on a surface of said base substrate; and
   conducting a laser annealing process to melt and crystallize said semiconductor film in which a region of said semiconductor film is irradiated with a line-shaped laser beam, the region of said semiconductor film irradiated by said line-shaped laser beam extending a longer distance in an X direction than in a Y direction, a half-width of an optical power profile in the Y direction of said line-shaped laser beam being smaller than the pixel pitch in the Y direction, wherein the X direction is defined as the direction in which said pixel thin-film transistors are aligned in substantially straight lines and the Y direction is defined as a direction crossing said X direction,
   said laser annealing process being performed before a patterning process in which said semiconductor film is patterned and an aligment between an annealing pattern is produced in said laser annealing process, and a mask pattern used in said patterning process being performed by using a color of said semiconductor film subjected to said laser annealing process, the color varying depending on an amount of irradiation caused by the line-shaped laser beam.

2. A method of producing an active matrix substrate according to claim 1, wherein in said laser annealing process, said semiconductor film is continuously melted and crystallized by moving said substrate in the Y direction relative to said line-shaped laser beam so that particular regions along the Y direction where said pixel thin-film transistors are to be formed are selectively irradiated by said line-shaped laser beam.

3. A method of producing an active matrix substrate according to claim 2, wherein in said laser annealing process, the particular regions along the Y direction where said pixel thin-film transistors are to be formed are continuously irradiated by said line-shaped laser beam.

4. A method of producing an active matrix substrate according to claim 1, wherein the alignment between an annealing pattern produced in said laser annealing process and the mask pattern used in said patterning process for said semiconductor film is performed by using an alignment mark produced in an underlying protective film formed under said semiconductor film.

5. A method of producing an active matrix substrate according to claim 1, wherein said laser annealing process is performed before said patterning process in which said semiconductor film is patterned.

6. A method of producing an active matrix substrate according to claim 1, wherein a predetermined area of said substrate is coated with a photo-setting resin before said laser annealing process, and said photo-setting resin is also irradiated by the laser beam in said laser annealing process thereby curing said photo-setting resin and forming an alignment pattern used, in a subsequent process, to align a mask relative to said substrate.

7. A method of producing an active matrix substrate according to claim 1, said pixel thin-film transistors are formed in such a manner that a channel length of each said pixel thin-film transistor extends in the X direction.

8. A method of producing an active matrix substrate according to claim 1, wherein a driver circuit including a plurality of driver thin-film transistors is formed on a driver circuit area disposed on said substrate in the Y-direction proximate an active matrix section in which said pixel regions are formed, the driver circuit area being annealed in said laser annealing process.

9. A method of producing an active matrix substrate according to claim 8, wherein in said laser annealing process, a travel speed of said substrate in the Y direction relative to said line-shaped laser beam is controlled so that predetermined areas of said semiconductor film are selectively annealed.

10. A method of producing an active matrix substrate according to claim 9, wherein in said laser annealing process, when the driver circuit area in which said driver circuit is to be formed is irradiated by said line-shaped laser beam, the travel speed of said substrate in the Y direction relative to said line-shaped laser beam is less than when pixel areas in which said pixel thin-film transistors are to be formed are irradiated by said line-shaped laser beam.

11. A method of producing an active matrix substrate according to claim 1, wherein an optical system is disposed between an optical path of said laser beam and said semiconductor film so that, when said laser annealing process is performed via said optical system, said line-shaped laser beam is converted via said optical system into a spot-shaped laser beam thereby selectively irradiating pixel areas along the X direction in which said pixel thin-film transistors are to be formed.

12. A method of producing an active matrix substrate according to claim 1, wherein after performing said laser annealing process on said semiconductor film, said semiconductor film is subjected to a rapid thermal annealing process.

13. A method of producing an active matrix substrate according to claim 1, wherein a rapid thermal annealing process is first performed on said semiconductor film, and then said semiconductor film is subjected to said laser annealing process.

14. A method of producing an active matrix substrate according to claim 12, wherein said substrate is simultaneously irradiated by the laser beam and an optical beam, the optical beam causing rapid thermal annealing.

15. A method of producing an active matrix substrate according to claim 1, wherein in addition to the laser beam for the purpose of the laser annealing, said substrate is also irradiated at the same time by an optical beam for the purpose of rapid thermal annealing in such a manner that said optical beam for the purpose of the rapid thermal annealing irradiates an area of said substrate, said irradiating area including a laser beam irradiating area irradiated by said laser beam for the purpose of the laser annealing.

16. An active matrix substrate produced by means of a method according to claim 1.

17. A liquid crystal display device including an active matrix substrate according to claim 16.

18. Electronic equipment including an active matrix substrate according to claim 16.

19. A method of annealing a semiconductor film applied on a surface of a substrate, comprising the steps of:
    moving the substrate in a first direction; and
    consecutively heating a plurality of selected regions of the semiconductor film by an optical heating source in the first direction and a second direction perpendicular to the first direction as the substrate moves in the first direction to cause melting and crystallization of the semiconductor film within the selected regions, wherein consecutive ones of the selected regions are disposed apart from one another in the first direction at a pitch and a half-width of an optical power profile of the optical heating source is less than the pitch,
    said consecutively heating and crystallization of the semiconductor film being performed before a patterning process in which said semiconductor film is patterned and an alignment between an annealing pattern is produced in said consecutively heating and crystallization, and a mask pattern used in said patterning process being performed by using a color of said semiconductor film subjected to said consecutively heating and crystallization, the color varying depending on an amount of irradiation caused by a line-shaped laser beam irradiating the semiconductor film.

20. The method according to claim 19, wherein the optical heating source is at least one of a laser beam device and a thermal heating device.

21. The method according to claim 20, wherein the laser beam device includes one of a line-shaped laser beam extending continuously across the semiconductor film in the second direction and a spot-shaped laser beam extending intermittently across the semiconductor film in the second direction.

22. The method according to claim 20, wherein the thermal heating device includes an arc lamp.

23. The method according to claim 19, wherein the plurality of selected regions include a plurality of groups of at least two selected regions wherein the at least two selected regions of each group are disposed relative to each other to extend in a straight line across the semiconductor film along the second direction.

24. The method according to claim 23, wherein the plurality of selected regions are arranged relative to one another in a matrix of rows and columns.

* * * * *